(12) United States Patent
Moriat

(10) Patent No.: US 7,568,178 B2
(45) Date of Patent: Jul. 28, 2009

(54) SYSTEM SIMULATION AND GRAPHICAL DATA FLOW PROGRAMMING IN A COMMON ENVIRONMENT USING WIRE DATA FLOW

(75) Inventor: Alain G. Moriat, Copenhagen (DK)

(73) Assignee: National Insturments Corporation, Austin, TX (US)

( * ) Notice: Subject to any disclaimer, the term of this patent is extended or adjusted under 35 U.S.C. 154(b) by 254 days.

(21) Appl. No.: 11/550,431

(22) Filed: Oct. 18, 2006

(65) Prior Publication Data

US 2008/0109779 A1    May 8, 2008

(51) Int. Cl.
*G06F 17/50* (2006.01)
(52) U.S. Cl. .................. 716/14; 716/1; 716/11; 716/18; 703/14
(58) Field of Classification Search ........... 716/1, 716/11, 14, 18
See application file for complete search history.

(56) References Cited

U.S. PATENT DOCUMENTS

| | | | |
|---|---|---|---|
| 5,481,741 A | | 1/1996 | McKaskle et al. |
| 5,617,327 A | | 4/1997 | Duncan |
| 5,652,909 A | * | 7/1997 | Kodosky ............ 717/125 |
| 5,819,072 A | * | 10/1998 | Bushard et al. ........ 716/10 |
| 6,219,628 B1 | | 4/2001 | Kodosky et al. |
| 7,152,027 B2 | | 12/2006 | Andrade et al. |
| 2002/0029371 A1 | | 3/2002 | Hwang et al. |
| 2002/0147576 A1 | | 10/2002 | Hsu et al. |
| 2003/0074638 A1 | | 4/2003 | Osaka et al. |
| 2007/0044030 A1 | | 2/2007 | Hayles |
| 2007/0044071 A1 | | 2/2007 | Hayles |
| 2007/0044072 A1 | | 2/2007 | Hayles |

OTHER PUBLICATIONS

U.S. Appl. No. 11/609,928, titled "User Defined Virtual Instruments in a Simulation Environment," filed Dec. 13, 2006, whose inventors are Kyle Gupton, Lingyun Pan, and Rajesh S. Vaidya.

* cited by examiner

*Primary Examiner*—Thuan Do
(74) *Attorney, Agent, or Firm*—Meyertons hood Kivlin Kowert & Goetzel, P.C.; Jeffrey C. Hood; Jason L. Burgess

(57) ABSTRACT

Various embodiments of systems and methods are described in which system simulation techniques are combined with graphical programming techniques in a common environment. For example, various embodiments of the methods comprise displaying a graphical data flow diagram connected to a system diagram, e.g., where the graphical data flow diagram and the system diagram are displayed together in a compound diagram. In the displayed compound diagram, the graphical data flow diagram may be connected to the system diagram, e.g., by a line or wire. In one embodiment the wire may visually indicate that the graphical data flow diagram is executable to produce a value that is provided as an input signal for a simulation performed based on the system diagram. In another embodiment the wire may visually indicate that the graphical data flow diagram receives an output value from the system simulation as input.

50 Claims, 16 Drawing Sheets

Computer System
82

SYSTEM SIMULATION AND GRAPHICAL DATA FLOW PROGRAMMING IN A COMMON ENVIRONMENT USING WIRE DATA FLOW

FIELD OF THE INVENTION

The present invention relates to the field of graphical data flow programming. The present invention also relates to the field of system simulation, e.g., simulation of a system such as a circuit or other physical system. More particularly, the invention relates to a method for creating a diagram including a graphical data flow diagram portion and a system diagram portion, where the graphical data flow portion is executable to produce an input signal for a simulation performed based on the system diagram and/or where the graphical data flow portion receives an output value from the simulation as input.

DESCRIPTION OF THE RELATED ART

The present invention relates to the field of graphical data flow programming. Traditionally, high level text-based programming languages have been used by programmers in writing application programs. Many different high level text-based programming languages exist, including BASIC, C, Java, FORTRAN, Pascal, COBOL, ADA, APL, etc. Programs written in these high level text-based languages are translated to the machine language level by translators known as compilers or interpreters. The high level text-based programming languages in this level, as well as the assembly language level, are referred to herein as text-based programming environments.

Increasingly, computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptualize a problem or process and then to program a computer to implement a solution to the problem or process. Since a user often is not fully proficient in techniques for programming a computer system in a text-based environment to implement his solution, the efficiency with which the computer system can be utilized often is reduced.

To overcome the above shortcomings, various graphical programming environments now exist which allow a user to construct a graphical program or graphical diagram, also referred to as a block diagram. U.S. Pat. Nos. 4,901,221; 4,914,568; 5,291,587; 5,301,301; and 5,301,336; among others, to Kodosky et al disclose a graphical programming environment which enables a user to easily and intuitively create a graphical program. Graphical programming environments such as that disclosed in Kodosky et al can be considered a higher and more intuitive way in which to interact with a computer. A graphically based programming environment can be represented at a level above text-based high level programming languages such as C, Basic, Java, etc.

A user may assemble a graphical program by selecting various blocks or icons which represent desired functionality, and then connecting the blocks or icons together to create the graphical program. Thus the block diagram may include a plurality of interconnected blocks such that the diagram created graphically displays a procedure or method for accomplishing a certain result, such as manipulating one or more input values and/or producing one or more output values. In response to the user constructing a block diagram or graphical program using the block diagram editor, data structures and/or program instructions may be automatically constructed which characterize an execution procedure that corresponds to the displayed procedure. The graphical program may be compiled or interpreted by a computer.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program, and may include other icons which represent devices being controlled.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for applications such as test and measurement, data acquisition, process control, man machine interface (MMI), supervisory control and data acquisition (SCADA) applications, modeling, image processing/machine vision applications, and motion control, among others.

The blocks in the block diagram of a graphical program may be connected by lines or wires representing one or more of data flow, control flow, and/or execution flow. A graphical program in which the blocks are connected primarily according to a data flow representation is referred to as a graphical data flow program. The block diagram for a graphical data flow program is also referred to as a graphical data flow diagram. Connections (e.g., lines or wires) between blocks in a graphical data flow diagram visually indicate that data produced by one block is used by another block. For example, a graphical data flow diagram may include a first block connected by a wire to a second block, where the wire visually indicates that output data produced by the first block is passed as input data to the second block.

The present invention also relates to the field of system simulation. Simulation of a system may be implemented using software, hardware, or a combination of both. Creating a system simulation typically involves creating a model of the system, where the model represents the system or represents certain aspects of the system. For a given system, the system may be modeled in any number of different ways. Thus, the type of model that is created may depend on the particular aspects of the system that the modeler is interested in or the particular purpose of performing the simulation.

Creating a model of a system generally involves simplifying or approximating certain aspects of the system. For some systems or problems, a simple, abstracted model may serve to solve the problem at hand quite well, whereas for other systems or problems, a more complex model representing many details of the actual system may be desirable.

There are many reasons why it may be necessary or desirable to simulate a system. One common situation where simulation is useful is when the real system has not yet been created. In this instance, the system may be simulated in order to test design variations and predict whether the planned system will operate as desired.

Any of various types of systems may be simulated. In general, a system model may model physical, mechanical, electrical, chemical, thermodynamic, and/or other types of behavior of the system under simulation. As a few illustrative examples, simulation may be performed for systems such as an electronic circuit or other electronic system, an engine or engine component, an object in motion, a chemical reaction, a petroleum refining process, a room maintained at a setpoint temperature, a system of liquids flowing among different tanks, etc.

SUMMARY

Various embodiments of systems and methods are described in which system simulation techniques are combined with graphical programming techniques in a common environment. For example, various embodiments of the methods comprise displaying a graphical data flow diagram connected to a system diagram, e.g., where the graphical data flow diagram and the system diagram are displayed together in a common diagram (also referred to herein as a "compound diagram"). In the displayed compound diagram, the graphical data flow diagram may be connected to the system diagram, e.g., by a line or wire. In one embodiment the wire may visually indicate that the graphical data flow diagram is executable to produce a value that is provided as an input signal for a simulation performed based on the system diagram. In another embodiment the wire may visually indicate that the graphical data flow diagram receives an output value from the system simulation as input.

BRIEF DESCRIPTION OF THE DRAWINGS

A better understanding of the present invention can be obtained when the following detailed description of the preferred embodiment is considered in conjunction with the following drawings, in which.

Figure 1:
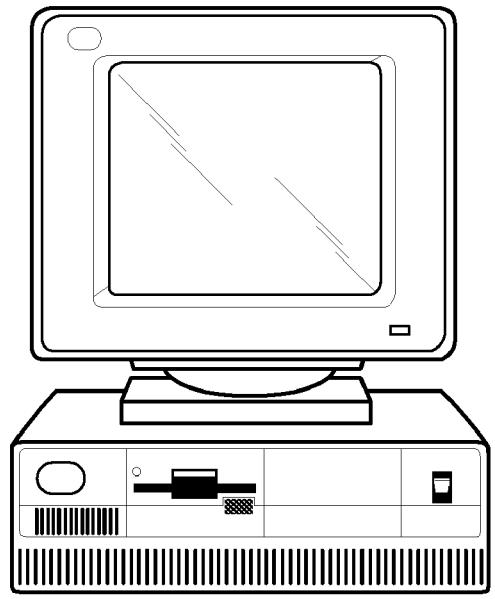
FIG. 1 illustrates a computer system operable to create, display, and/or run a compound diagram, where the compound diagram includes a graphical data flow diagram connected to a system diagram.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

U.S. patent application Ser. No. 10/046,861 titled, "System and Method for Performing a Hardware in the Loop Simulation Using a Plurality of Graphical Programs that Share a Single Graphical User Interface," filed Jan. 15, 2002.

U.S. patent application Ser. No. 10/892,829 titled, "A Graphical Program Which Executes a Timed Loop," filed Jul. 16, 2004.

U.S. patent application Ser. No. 11/203,816 titled, "Combination Structure Nodes for a Graphical Program," filed Aug. 15, 2005.

U.S. patent application Ser. No. 11/356,711 titled, "Solver for Simulating a System in Real Time on a Programmable Hardware Element," filed Feb. 17, 2006.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a bit file, that can be used to program or configure a programmable hardware element.

Graphical Program—A program comprising a plurality of interconnected blocks or icons, wherein the plurality of interconnected blocks or icons visually indicate functionality of the program.

The following provides examples of various aspects of graphical programs. The following examples and discussion are not intended to limit the above definition of graphical program, but rather provide examples of what the term "graphical program" encompasses:

The blocks in a graphical program may be connected in one or more of a data flow, control flow, and/or execution flow format. The blocks may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, Vis Sim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected blocks or icons that visually indicate operation of the model or block diagram; exemplary graphical modeling environments include Simulink, SystemBuild, Vis Sim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks are often referred to as the block diagram portion of the graphical program.

Block—In the context of a graphical program, an element that may be included in a graphical program. A block may have an associated icon that represents the block in the graphical program, as well as underlying code or data that implements functionality of the block. Exemplary blocks include function blocks, sub-program blocks, terminal blocks, structure blocks, etc. Blocks may be connected together in a graphical program by connection icons or wires.

The blocks in a graphical program may also be referred to as graphical program nodes or simply nodes (not to be confused with the nodes that connect components in a circuit diagram).

Graphical Data Flow Program (or Graphical Data Flow Diagram)—A graphical program or diagram comprising a plurality of interconnected blocks, wherein at least a subset of the connections among the blocks visually indicate that data produced by one block is used by another block. A LabVIEW VI is one example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with blocks in the graphical program. For example, when Input Controls and Output Indicators are created in the GUI, corresponding blocks (e.g., terminals) may be automatically created in the graphical program or block diagram. Alternatively, the user can place terminal blocks in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Referring now to FIG. 1, a computer system 82 is illustrated. The computer system 82 may be operable to execute software operable to display a diagram referred to herein as a "compound diagram," where the compound diagram includes both a graphical data flow diagram portion and a system diagram portion. The compound diagram may be displayed on a display device of the computer system 82, such as an LCD screen, CRT monitor, or other display device.

The graphical data flow diagram may comprise a plurality of interconnected blocks that visually indicate a process, e.g., an algorithm or function. The graphical data flow diagram may be executable to perform the process, e.g., after being compiled or interpreted into executable program instructions. The blocks in the graphical data flow diagram may be interconnected by lines or wires that represent data flow among the blocks. For example, the graphical data flow diagram may include a first block connected by a wire to a second block, where the wire visually indicates that output data produced by execution of the first block is passed as input data to the second block.

The system diagram may comprise a diagram of a system, e.g., a physical system. As one example, the system diagram may comprise a diagram of a circuit, e.g., an analog circuit or other electrical circuit. The system diagram may represent a model of the system and may be used to simulate the system, possibly after first being converted into another format, e.g., one or more data structures or equations describing the system. For example, as described below, in some embodiments the system diagram may be automatically converted into a set of mathematical equations that represent the system, where the mathematical equations are used by a solver to perform a simulation of the system, such as a time domain solver that performs a time domain simulation or a frequency domain solver that performs a frequency domain simulation.

The system diagram may include a plurality of components, e.g., where each component represents a physical component of the system. The system diagram may also include lines or wires that interconnect the components. However, the lines or wires in the system diagram may differ from the lines or wires in the graphical data flow diagram in that the lines or wires in the system diagram do not directly represent data flow among the system components. For example, the lines or wires in the system diagram may represent physical connections or other physical relationships between physical components in the system. For example, in a circuit diagram, a wire (node) may be displayed between a first resistor component and a second resistor component, where the wire represents a physical connection between the resistors.

The system diagram may also differ from the graphical data flow diagram in that the system diagram does not directly represent an executable program process. For example, instead of being compiled or interpreted into executable program instructions, the system diagram may be used by other program logic to perform a simulation of the system, possibly after being converted into data structures or equations that represent the system, as described above.

In the displayed compound diagram, the graphical data flow diagram may be connected to the system diagram, e.g., by a line or wire. In one embodiment the wire may visually indicate that the graphical data flow diagram is executable to produce a value that is provided as an input signal for the simulation performed based on the system diagram. In another embodiment the wire may visually indicate that the graphical data flow diagram receives an output value from the system simulation as input.

In some embodiments the compound diagram may include multiple graphical data flow diagrams. For example, the compound diagram may include a first wire between a first graphical data flow diagram and the system diagram, where the first wire visually indicates that the first graphical data flow diagram is executable to produce a value that is provided as an input signal for the simulation performed based on the system diagram. The compound diagram may also include a second wire between the system diagram and a second graphical data flow diagram, where the second wire visually indicates that the second graphical data flow diagram receives an output value from the system simulation as input.

Also, in some embodiments the compound diagram may include multiple system diagrams. For example, the compound diagram may include a first wire between a first system diagram and the graphical data flow diagram, where the first wire visually indicates that the graphical data flow diagram receives an output value from a first simulation performed on the first system diagram. The compound diagram may also include a second wire between the graphical data flow diagram and a second system diagram, where the second wire visually indicates that the graphical data flow diagram is executable to produce a value that is provided as an input signal for a second simulation performed on the second system diagram.

In some embodiments the software executed by the computer system 82 may also be operable to create the compound diagram, e.g., in response to user input. Exemplary methods for creating the compound diagram are described below.

In some embodiments the software executed by the computer system 82 may also be operable to run the compound diagram. Running the compound diagram may comprise executing the graphical data flow diagram and performing a simulation based on the system diagram. In some embodiments, running the compound diagram may also comprise providing an output value of the graphical data flow diagram as an input signal for the simulation, e.g., in embodiments where the compound diagram includes a connection visually indicating this behavior. In other embodiments, running the compound diagram may also comprise providing a value computed by the simulation as an input value to the graphical data flow diagram, e.g., in embodiments where the compound diagram includes a connection visually indicating this behavior.

The functions described above of creating, displaying, and running a compound diagram that includes a graphical data flow diagram portion connected to a system diagram portion may be implemented by one or more software applications or programs collectively referred to herein as "diagramming software". In one embodiment the diagramming software may comprise a single software application, e.g., development environment application, operable to create, display, and run the compound diagram. In other embodiments, two or more software applications may operate together to implement one or more of these functions. As one example, the compound diagram may be created and displayed in a first application, and the first application may interface with a second application in order to run the compound diagram, e.g., may interface with a simulation application that performs a simulation on the system diagram and/or may interface with a graphical program runtime engine that executes the graphical data flow diagram. As another example, the graphical data flow diagram may be created in a first application, the system diagram may be created in a second application, and the system diagram may be imported into the first application and displayed together with the graphical data flow diagram in a compound diagram.

Referring again to FIG. 1, the computer system 82 may include one or more memory mediums that store the diagramming software. The memory medium(s) may also store operating system software, as well as other software for operation of the computer system. The memory medium(s) may also store a compound diagram created by the diagramming software, e.g., may store one or more files or data structures representing the compound diagram. The computer system 82 may also include one or more processors that execute the diagramming software and other software.

It is noted that in some embodiments, the functions described above of creating, displaying, and running a compound diagram may be performed by multiple computer systems or computing devices. For example, in some embodiments the compound diagram may be created and displayed on a first computer system 82A, and may then be transferred to another computer system 82B that runs the compound diagram.

As another example, in some embodiments, multiple computer systems or computing devices may operate in conjunction with each other to run the compound diagram. For example, in one embodiment a first computer system 82A may execute the graphical data flow diagram, and another computer system 82B may perform the simulation based on the system diagram. The computer systems may communicate to exchange data, e.g., to provide data produced by execution of the graphical data flow diagram as an input signal for the simulation and/or to provide a simulation value computed by the simulation as input data to the graphical data flow diagram.

Figure 2:
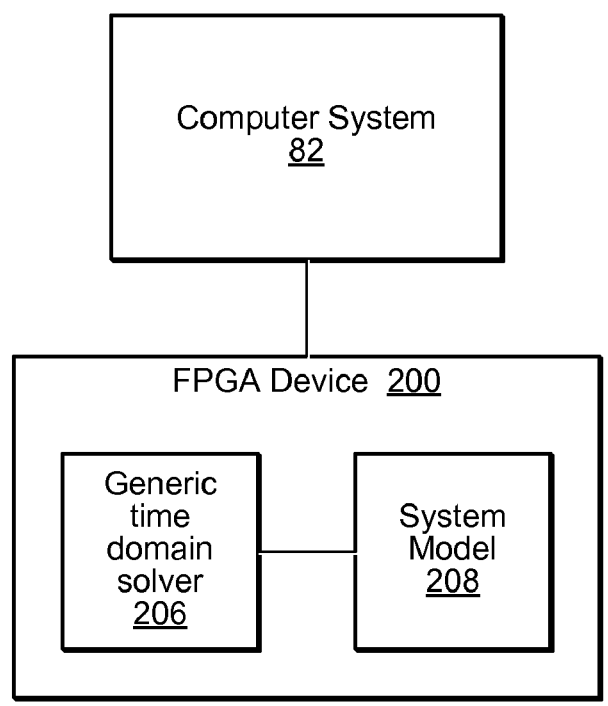
FIG. 2 illustrates an embodiment in which the computer system couples to a Field Programmable Gate Array (FPGA) device.

As another example, the computer system 82 may couple to a device that includes programmable hardware in order to run the compound diagram. For example, FIG. 2 illustrates an embodiment in which the computer system 82 couples to a Field Programmable Gate Array (FPGA) device 200. In this example, the FPGA device 200 includes programmable hardware configured to implement a generic time domain solver 206. The FPGA device 200 is also configured to store a system model 208, e.g., where the system model 208 is automatically generated by converting the system diagram into data structures and/or equations that represent the system under simulation. Thus, the computer system 82 may execute the graphical data flow diagram, and the FPGA device 200 may perform the system simulation. In some embodiments, performing the system simulation on the FPGA device 200 or other programmable hardware may enable the simulation to proceed faster than if the simulation were performed in software executing on the computer system 82. The computer system 82 may exchange data with the FPGA device 200 to implement the connection(s) shown in the compound diagram between the graphical data flow diagram and the system diagram, similarly as described above.

Figure 3:
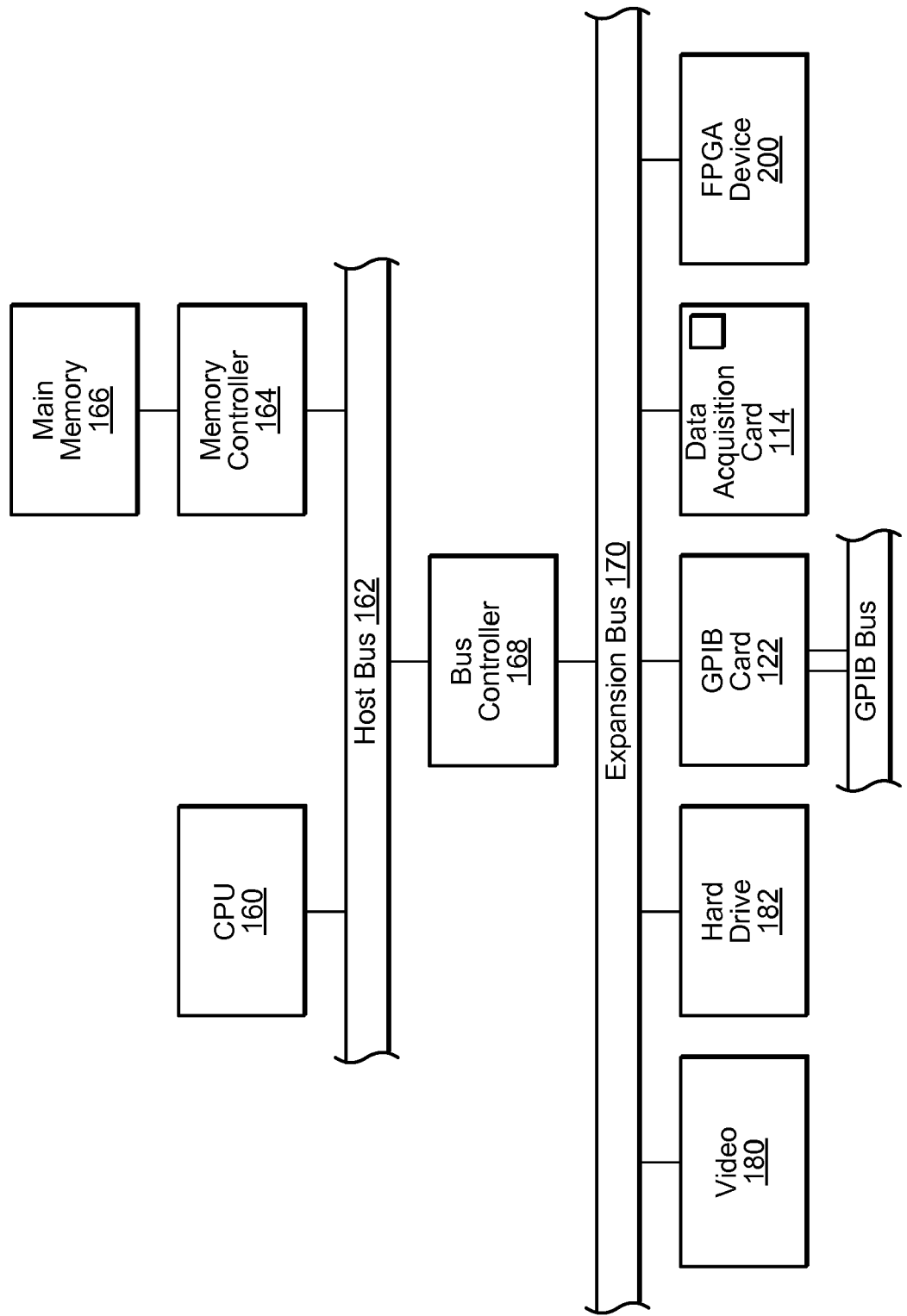
FIG. 3 is a block diagram representing one embodiment of the computer system in more detail.

FIG. 3 is a block diagram representing one embodiment of the computer system 82 in more detail. It is noted that any type of computer system configuration or architecture can be used as desired, and FIG. 3 illustrates a representative PC embodiment. It is also noted that the computer system 82 may be a general purpose computer system, a computer implemented on a card installed in a chassis, or other types of embodiments. Elements of a computer not necessary to understand the present description have been omitted for simplicity.

In the illustrated embodiment, the computer system 82 includes at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store diagramming software such as described above with reference to FIG. 1.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices that couple to the computer system 82, such as a GPIB card 122 and a Data Acquisition (DAQ) card 114. In the illustrated embodiment, the computer system 82 further comprises a video display subsystem 180 and hard drive 182 coupled to the expansion bus 170.

In the illustrated embodiment, an FPGA device 200 is also coupled to the computer system 82. As discussed above, in some embodiments the FPGA device 200 may be configured to perform a simulation based on the system diagram portion of a compound diagram. In other embodiments, the FPGA device 200 may not be present (e.g., the simulation may be performed by the diagramming software executing on the computer system 82 or executing on another computer system), or the FPGA device 200 may be coupled to the computer system 82 through techniques other than an expansion bus, or the simulation may be performed on a device other than the FPGA device 200, e.g., a device that includes another type of programmable hardware element.

Figure 4:
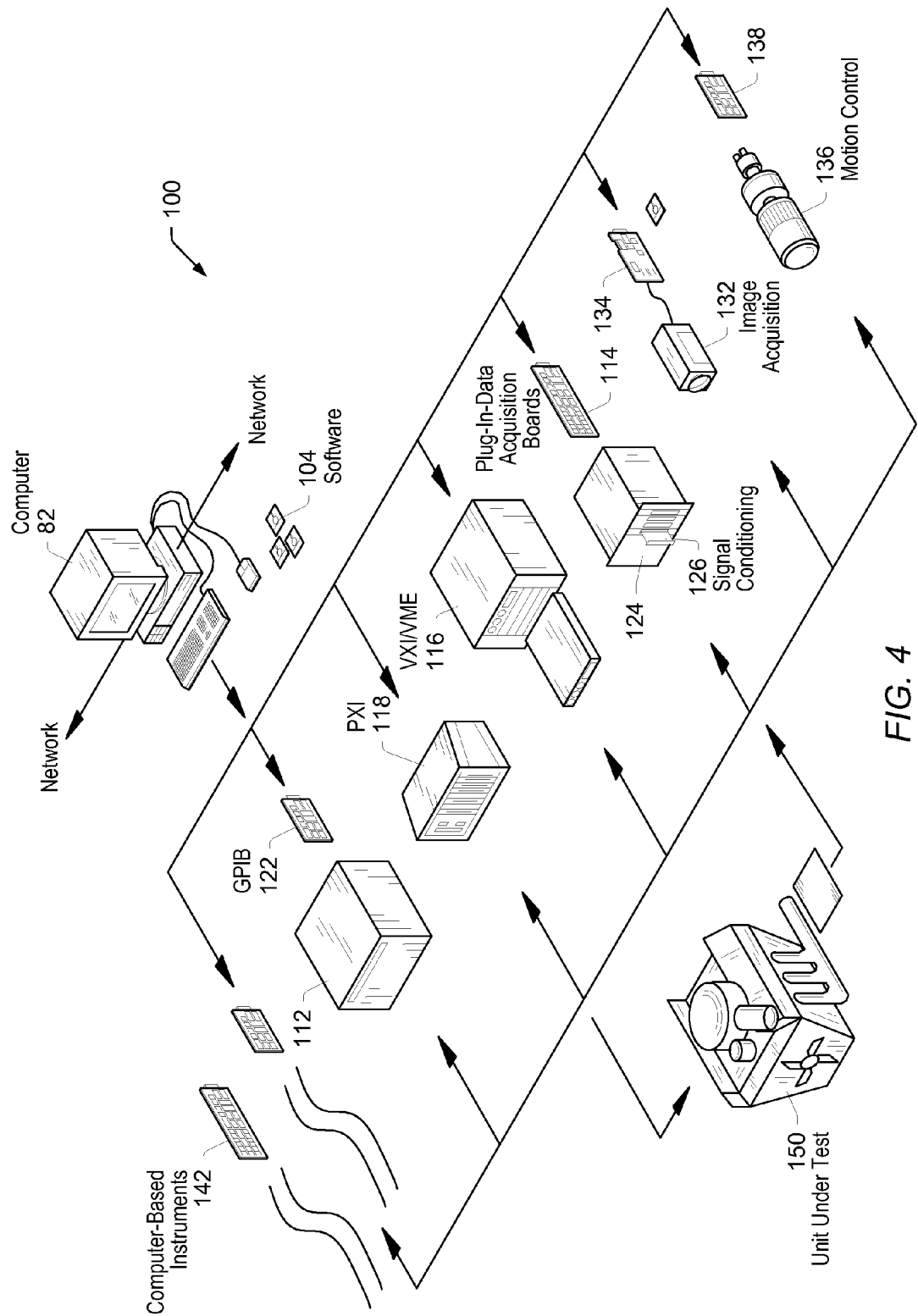
FIG. 4 illustrates an exemplary instrumentation control system in which the computer system connects to one or more instruments.

FIG. 4 illustrates an exemplary instrumentation control system 100 in which a host computer 82 connects to one or more instruments. The host computer 82 may comprise a CPU, a display screen, memory, and one or more input devices such as a mouse or keyboard as shown. In some embodiments the computer 82 may execute the graphical data flow diagram portion of a compound diagram, where the graphical data flow diagram is operable to communicate with one or more instruments such as shown in FIG. 4. For example, in some embodiments the graphical data flow diagram may execute to communicate with the one or more instruments to analyze, measure or control a unit under test (UUT) or process 150.

In other embodiments, one or more instruments such as shown in FIG. 4 may be utilized in the system simulation performed based on the system diagram. As one example, the system simulation may be performed by an FPGA device 200, as described above. One or more instruments may be coupled to the FPGA device 200, e.g., where the one or more instruments provide input signals affecting the simulation to the FPGA device 200 and/or receive output signals computed by the simulation from the FPGA device 200.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The GPIB instrument 112 may be coupled to the computer 82 via the GPIB interface card 122 provided by the computer 82. In a similar manner, the video device 132 may be coupled to the computer 82 via the image acquisition card 134, and the motion control device 136 may be coupled to the computer 82 through the motion control interface card 138. The data acquisition board 114 may be coupled to the computer 82, and may interface through signal conditioning circuitry 124 to the UUT. The signal conditioning circuitry 124 may comprise an SCXI (Signal Conditioning eXtensions for Instrumentation) chassis comprising one or more SCXI modules 126.

The GPIB card 122, the image acquisition card 134, the motion control interface card 138, and the DAQ card 114 are typically plugged in to an I/O slot in the computer 82, such as a PCI bus slot, a PC Card slot, or an ISA, EISA or Micro-Channel bus slot provided by the computer 82. However, these cards 122, 134, 138 and 114 are shown external to computer 82 for illustrative purposes. These devices may also be connected to the computer 82 through a serial bus or through other means.

The VXI chassis or instrument 116 may be coupled to the computer 82 via a VXI bus, MXI bus, or other serial or parallel bus provided by the computer 82. The computer 82 may include VXI interface logic, such as a VXI, MXI or GPIB interface card (not shown), which interfaces to the VXI chassis 116. The PXI chassis or instrument may be coupled to the computer 82 through the computer's PCI bus.

A serial instrument (not shown) may also be coupled to the computer 82 through a serial port, such as an RS-232 port, USB (Universal Serial bus) or IEEE 1394 or 1394.2 bus, provided by the computer 82. In typical instrumentation control systems an instrument will not be present of each interface type, and in fact many systems may only have one or more instruments of a single interface type, such as only GPIB instruments.

The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application.

In one embodiment, one or more of the various instruments illustrated in FIG. 4 may couple to the computer 82 over a network, such as the Internet, an Ethernet network, or other wired or wireless network connection.

Figure 5:
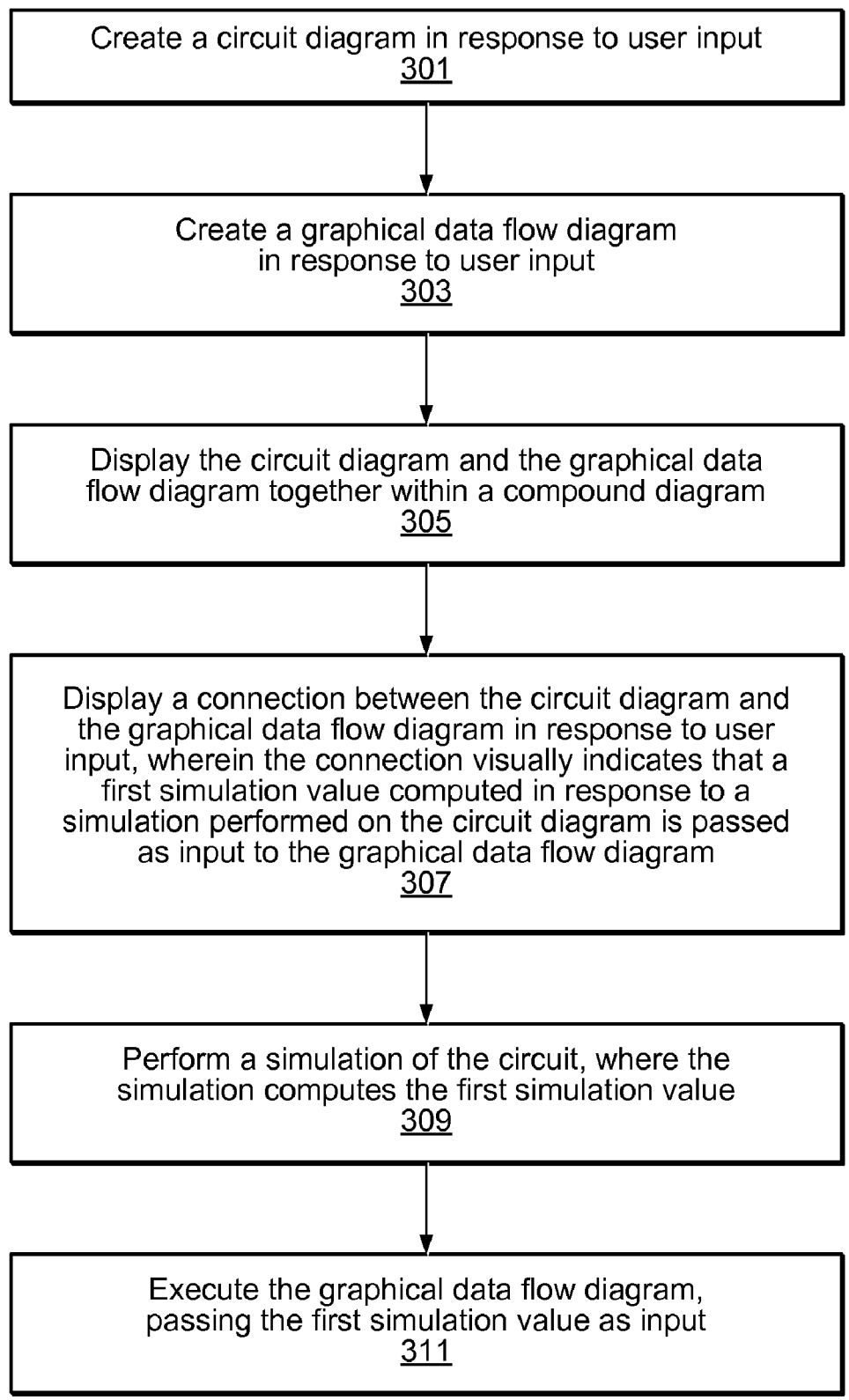
FIG. 5 is a flowchart diagram illustrating one embodiment of a method for creating, displaying, and running a compound diagram, where the compound diagram includes a graphical data flow diagram connected to a circuit diagram such that the graphical data flow diagram receives a value computed by a simulation performed on the circuit diagram as input.

FIG. 5 is a flowchart diagram illustrating one embodiment of a method for creating, displaying, and running a compound diagram, where the compound diagram includes a graphical data flow diagram connected to a system diagram such that the graphical data flow diagram receives a value computed by a simulation performed on the system diagram as input. It is noted that FIG. 5 represents an exemplary embodiment of the method, and various alternative embodiments are contemplated. The method of FIG. 5 may be implemented by diagramming software executing on the computer system 82.

In various embodiments, the system diagram displayed in the compound diagram may represent any of various kinds of systems. For example, in some embodiments the system diagram may represent a physical system that includes electrical, mechanical, chemical, thermodynamic, or other types of physical components. In particular, in some embodiments the system diagram may represent a physical device. The flowchart of FIG. 5 represents an embodiment in which the system diagram comprises a circuit diagram, e.g., a diagram representing an analog circuit, digital circuit, or other electrical circuit.

In 301, the circuit diagram may be created in response to user input, where the circuit diagram represents a circuit to be simulated. For example, in some embodiments the user may arrange icons representing components of the circuit within a window displayed on the display device of the computer system 82 in order to create a visual representation of the circuit. For example, the diagramming software may provide a graphical user interface enabling the user to select from a library of circuit components, such as transistors, resistors, capacitors, inductors, switches, voltage and current sources, etc., and display the selected circuit components in the circuit diagram in response to user input. The graphical user interface may also enable the user to create wires, also referred to as nodes, connecting the various circuit components. Thus, in some embodiments the user may create the circuit diagram in a direct graphical manner, e.g., by directly creating a visual representation of the circuit.

In other embodiments the user may create the circuit diagram in an indirect manner, e.g., by specifying lines of text in a circuit description language, where the lines of text describe the circuit, such as the components in the circuit and how they are connected to each other. The circuit diagram may be automatically generated based on the text describing the circuit.

In yet other embodiments the user may interact with one or more graphical user interface dialogs to select various options indicating desired features of the circuit, and the diagramming software may then automatically create a circuit diagram having the features selected by the user.

In addition to specifying the components of the circuit and the nodes connecting the components together, the user may also specify various properties or parameters of the components. For example, for a resistor component, the user may specify the resistance value. As another example, for a voltage source component, the user may specify the voltage value. The component properties may be specified in various ways, such as by interacting with graphical user interface dialogs for configuring the property values for various circuit components, specifying the property values in a text language, or displaying property value icons representing the property values within the circuit diagram and connecting the property value elements to the respective circuit component icons in the circuit diagram.

In some embodiments, creating the circuit diagram may also comprise specifying an input signal to the circuit diagram. For example, the circuit diagram may represent an analog circuit or other electrical circuit operable that operates with an electrical signal as input. In various embodiments the diagramming software may allow the user to specify the input signal for the circuit diagram in various ways, e.g., by connecting an icon representing the input signal to a component or wire in the circuit diagram or interacting with a graphical user interface dialog to configure the input signal. Also, in some embodiments the input signal may be provided as output from a graphical data flow diagram, as described below with reference to FIG. 10.

Referring again to FIG. 5, in 303 a graphical data flow diagram may be created in response to user input. Creating the graphical data flow diagram may comprise assembling and interconnecting a plurality of blocks in the graphical data flow diagram in response to user input. The graphical data flow diagram may be displayed on the display device of the computer system 82.

For example, the user may create the graphical data flow diagram by selecting desired blocks from a palette or menu of available blocks and placing or "dragging and dropping" the selected blocks into the graphical data flow diagram. For example, the blocks included in the graphical data flow diagram may include function blocks (e.g., blocks operable to perform a particular function), sub-program blocks (e.g., blocks that encapsulate another graphical data flow diagram), control blocks (e.g., blocks operable to perform control flow functions such as looping or case selections, also referred to as structure blocks or structure nodes), etc.

The user may also interconnect the blocks in the graphical data flow diagram in a desired fashion, e.g., by creating lines or wires among the blocks. In particular, the user may interconnect the blocks to visually indicate data flow among the blocks. For example, the user may utilize a wiring tool or wiring function provided by the diagramming software to display a wire connecting an output terminal of a first block to an input terminal of a second block, such that the wire visually indicates that the first block produces output data that is passed as input data to the second block.

Thus, the blocks in the graphical data flow diagram may be interconnected in response to user input in order to visually indicate desired functionality of the graphical data flow diagram. For example, the plurality of interconnected blocks may visually indicate a process or function performed by the graphical data flow diagram when the graphical data flow diagram is executed. In various embodiments the user may create a graphical data flow diagram operable to perform any process, function, or algorithm.

The graphical data flow diagram may thus include a plurality of blocks that execute according to data flow semantics during execution of the graphical data flow diagram. For example, blocks in the graphical data flow diagram may obey the following semantic principles: a) The order of execution of the blocks is not explicitly specified by the user; b) The order of execution of the blocks is implied by data interdependencies; c) A block in the graphical data flow diagram begins execution in response to all of its necessary inputs becoming available.

In some embodiments, the graphical data flow diagram may also include one or more blocks that do not completely follow data flow semantic principles, e.g., blocks providing functionality or capabilities that do not adhere to data driven execution. These blocks may be referred to as "control flow blocks," "structure blocks," or "structure nodes". For example, these blocks may support various types of control flow (or execution flow), as opposed to data flow, such as iteration, looping, conditional branching, sequencing, event-driven execution, and other non-data flow behavior.

As one example, the LabVIEW graphical programming environment includes a While Loop structure node, a For Loop structure node, a Sequence structure node, and a Case structure node. In the While Loop structure node, graphical code associated with the While Loop structure node repeatedly executes for a plurality of iterations while a condition is true. In the For Loop structure node, graphical code associated with the For Loop structure node executes for a predetermined number of iterations set by the user. In the Sequence structure node, the user can specify different portions of graphical code to execute according to a desired sequence, without regard to data flow principles. In the Case structure node, different portions of graphical code may execute dependent on a condition.

A graphical code portion, i.e., one or more of the blocks in the graphical data flow diagram, may be associated with a structure node or control flow block, typically in a visual fashion, to indicate that this graphical code portion is executed according to the control flow function performed by the structure node. In other words, execution of the blocks in the graphical code portion associated with the structure node is controlled by the structure node, whereas execution of graphical code that is not associated with the structure node is not controlled by the structure node, but instead follows normal data flow principles.

Execution of the graphical code portion associated with a structure node or control flow block may be controlled in any of various ways, depending on the control flow function performed by the structure node. It is noted that once the execution of the graphical code portion associated with the structure node has begun, the graphical code portion may execute according to data flow principles. For example, in the case of a While Loop structure node, blocks in the graphical code portion associated with the While Loop structure node may execute according to data flow principles during each iteration of the loop. However, the While Loop controls the overall execution of the graphical code portion and causes the iteration to occur, whereas iteration may not normally occur in a data flow program.

It is also noted that various structure nodes or control flow blocks may obey data flow principles at their inputs and outputs. For example, a structure node or control flow block itself may be connected to other blocks in the graphical data flow diagram according to a data flow format. As one example, a function block may be connected to an input terminal of a For Loop structure node, where the function block outputs an integer value used to specify the desired number of iterations for the For Loop. As another example, output data produced by the graphical code portion associated with the For Loop may be passed as input to other blocks in the graphical data flow diagram.

In some embodiments the graphical data flow diagram may also include a user interface portion or front panel portion. Where the graphical data flow diagram includes a user interface portion, the user may assemble the user interface on the display, e.g., by arranging various user interface elements on the display.

Although the creation of the graphical data flow diagram in 303 is described above in terms of the user arranging and interconnecting blocks in the graphical data flow diagram as desired, in other embodiments the graphical data flow diagram may be created in any of various other ways. For example, in some embodiments the user may interact with one or more graphical user interface dialogs to select various options indicating desired execution functionality, and the diagramming software may then automatically generate a graphical data flow diagram operable to perform the functionality selected by the user.

Referring again to FIG. 5, the circuit diagram and the graphical data flow diagram may be displayed together within a compound diagram, as illustrated in 305. For example, the compound diagram may be displayed on the display device of the computer system 82, where the compound diagram includes both the circuit diagram and the graphical data flow diagram. For example, the circuit diagram and the graphical data flow diagram may be displayed together in a single graphical user interface window.

In some embodiments, the user may create the circuit diagram and the graphical data flow diagram using a common development environment application. For example, the development environment application may display a window in which the user creates both the circuit diagram and the graphical data flow diagram, as described above with reference to 301 and 303.

In another embodiment the user may create the circuit diagram and the graphical data flow diagram separately from each other, e.g., in separate windows or possibly using different software applications. In this embodiment the circuit diagram and the graphical data flow diagram are preferably displayed together in the compound diagram after being separately created. For example, after the user has created the circuit diagram and the graphical data flow diagram, the user may then request the circuit diagram to be imported into the graphical data flow diagram so that it is displayed together with the graphical data flow diagram, or vice versa.

As indicated in 307, the method may further comprise displaying a connection between the circuit diagram and the graphical data flow diagram in response to user input. For example, the user may use a wiring tool or wiring function to create a wire, line, or other connection icon connecting the circuit diagram to the graphical data flow diagram. The connection may visually indicate that a first simulation value computed in response to a simulation performed on the circuit diagram is passed as input to the graphical data flow diagram, as described below.

For example, the user may provide user input causing a first wire to be displayed, where the first wire connects a wire (node) in the circuit diagram to an input terminal of a block in the graphical data flow diagram. The first wire may visually indicate that a value associated with the circuit wire (e.g., a voltage value along the circuit wire or other electrical characteristic of the circuit wire) is computed by the simulation and is passed as input to the block in the graphical data flow diagram.

As another example, the user may provide user input causing a first wire to be displayed, where the first wire connects a component icon in the circuit diagram to an input terminal of a block in the graphical data flow diagram. The first wire may visually indicate that a value associated with the component (e.g., an electrical characteristic of the component) is computed by the simulation and is passed as input to the block in the graphical data flow diagram.

As discussed above, the circuit diagram represents a model of the circuit and may be used to perform a simulation of the circuit, e.g., a time domain simulation or other simulation. In 309, the simulation of the circuit is performed. Performing the simulation of the circuit may comprise computing various simulation values that characterize operation of the circuit, such as voltage and current values along the wires in the circuit, or other simulation values that represent electrical characteristics of various components or wires in the circuit. In particular, the simulation may compute the first simulation value, i.e., the simulation value that the connection created in 307 visually indicates as being passed as input to the graphical data flow diagram. For example, where the connection created in 307 connects a wire in the circuit diagram to a block in the graphical data flow diagram, performing the simulation may comprise computing a voltage value for the wire in the circuit diagram.

The method may further comprise executing the graphical data flow diagram, as indicated in 311. The first simulation value computed in the circuit simulation may be passed as input to the graphical data flow diagram. For example, where the connection created in 307 connects a wire in the circuit diagram to an input terminal of a first block in the graphical data flow diagram, a voltage value may for the circuit wire may be computed by the simulation in 309 and passed as input data to the first block in the graphical data flow diagram in 311. Executing the graphical data flow diagram may comprise executing the first block (e.g., executing program instructions corresponding to the first block), where the first block uses the first simulation value computed in the circuit simulation as an input parameter.

In various embodiments the graphical data flow diagram may execute to perform any of various functions, processes, or algorithms, where the first simulation value received from the circuit simulation may be used by the graphical data flow diagram in any of various ways. Examples of several graphical data flow diagrams that use simulation values computed by circuit simulations are described below.

In further embodiments of the method of FIG. 5, the user may create multiple connections between the circuit diagram and the graphical data flow diagram. Each connection may visually indicate that a respective simulation value is computed by the circuit simulation and passed as input to a respective block in the graphical data flow diagram. For example, the user may create a first connection from a first circuit wire or circuit component in the circuit diagram to a first block in the graphical data flow diagram and a second connection from a second circuit wire or circuit component in the circuit diagram to a second block in the graphical data flow diagram. The first connection may visually indicate that a first simulation value associated with the first circuit wire or circuit component is computed by the circuit simulation and passed as input to the first block in the graphical data flow diagram, and the second connection may visually indicate that a second simulation value associated with the second circuit wire or circuit component is computed by the circuit simulation and passed as input to the second block in the graphical data flow diagram.

As another example, the user may create multiple graphical data flow diagrams and connect each graphical data flow diagram to the circuit diagram such that blocks in each respective graphical data flow diagram receive one or more simulation values computed by the circuit simulation as input parameter values.

Figure 6:
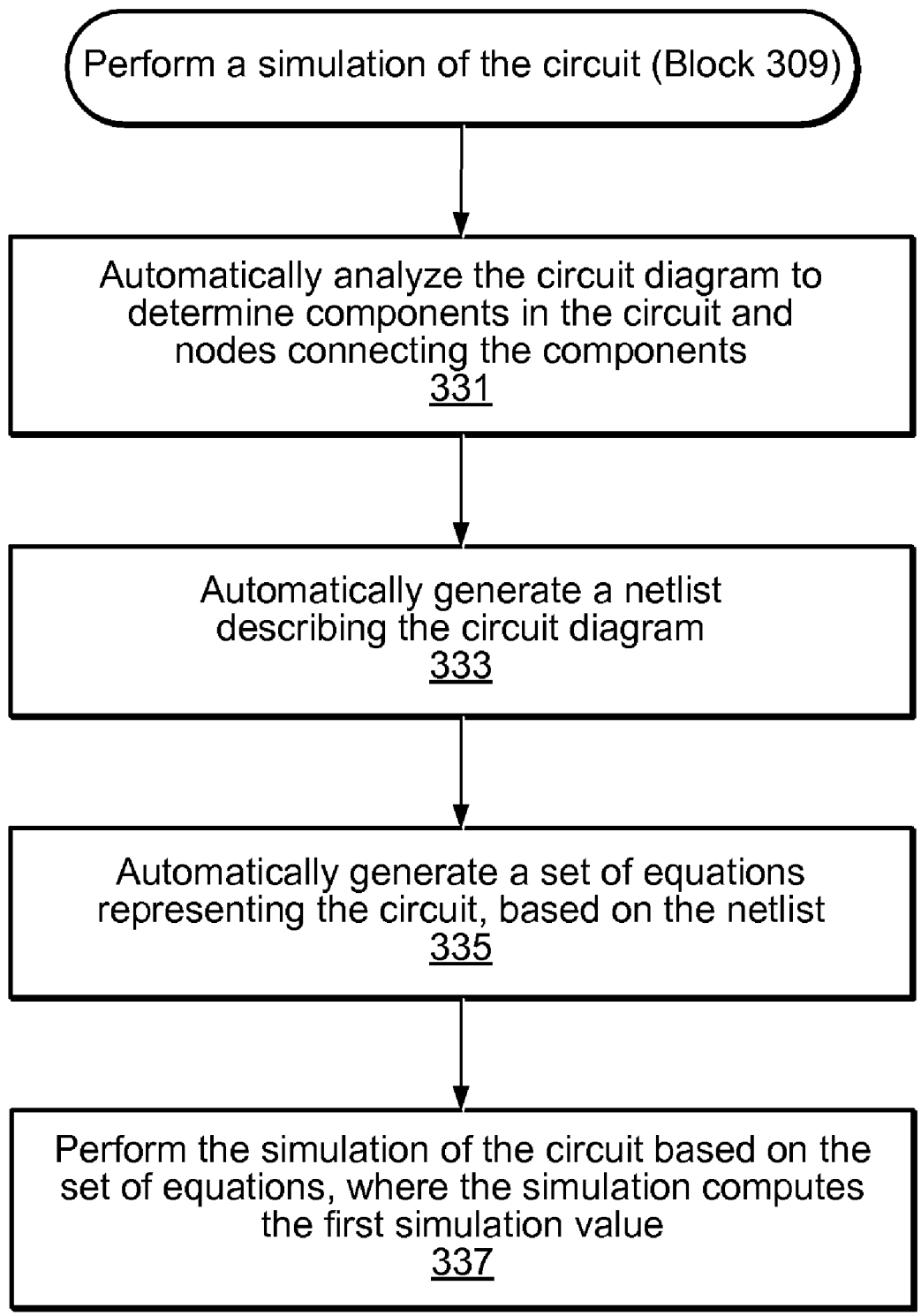
FIG. 6 is a flowchart diagram illustrating an exemplary method for performing a circuit simulation according to one embodiment.

In various embodiments, the simulation of the circuit in block 309 of FIG. 5 may be performed in any of various ways. FIG. 6 is a flowchart diagram illustrating an exemplary method for performing the circuit simulation according to one embodiment. The method of FIG. 6 may be implemented by diagramming software executing on the computer system 82.

In 331, the circuit diagram may be automatically analyzed to determine components in the circuit and wires (nodes) connecting the components. For example, the diagramming software may programmatically examine one or more data structures representing the circuit diagram to determine what components are in the circuit, how the components are connected to each other, properties of the components, etc.

In 333, a netlist describing the circuit diagram may be automatically generated. Generating the netlist may comprise generating one or more data structures that characterize the circuit, e.g., where the data structures specify what components are in the circuit, specify the circuit wires that connect the components to each other, specify properties of the components, etc. The one or more data structures representing the netlist may be stored in memory of the computer system 82.

In 335, a set of mathematical equations representing the circuit may be automatically generated, based on the netlist. In 337, the simulation of the circuit may be performed based on the set of equations. For example, in one embodiment the set of equations generated in 335 may represent time domain response behavior of the circuit. Thus, in 337 performing the simulation of the circuit may comprise a solver solving the equations to perform a time domain response simulation of the circuit.

The set of equations generated in 335 may be represented in any of various ways. For example, in one embodiment the netlist may be automatically converted into a set of matrix coefficients, where the matrix coefficients specify the set of equations. The matrix coefficients may be stored as one or more data structures.

As described above, performing the simulation of the circuit may comprise computing various simulation values that characterize operation of the circuit, such as voltage and current values along the wires in the circuit, or other simulation values that represent electrical characteristics of various components or wires in the circuit. In particular, the simulation may compute the first simulation value, i.e., the simulation value that the connection created in 307 visually indicates as being passed as input to the graphical data flow diagram.

As described above, in creating the circuit diagram, the user may also specify an input signal to the circuit. The simulation of the circuit may utilize the input signal in computing the various simulation values. Thus, the simulation of the circuit may depend on both the circuit itself (e.g., the components in the circuit, the properties of the components, and the connections among the components) and the input signal. For example, in a time domain simulation the solver may utilize data representing the input signal as parameters in solving the equations that represent the circuit, and/or the equations may be generated based on the input signal as well as the netlist.

As discussed above, in some embodiments the circuit simulation may be performed on an FPGA device 200 or other programmable hardware device. For example, the FPGA device 200 may be configured to implement a generic time domain solver 206. The computer system 82 may communicate with the FPGA device 200, e.g., to upload the set of matrix coefficients to the FPGA device 200. The generic time domain solver 206 on the FPGA device 200 may perform a time domain response simulation of the circuit based on the matrix coefficients.

In one embodiment where the circuit simulation is performed on the FPGA device 200, the graphical data flow diagram may execute on the computer system 82. The computer system 82 may communicate with the FPGA device 200 to receive the first simulation value computed by the circuit simulation and pass the first simulation value to the graphical data flow diagram. In another embodiment the graphical data flow diagram may also be performed on the FPGA device 200 together with the circuit simulation, e.g., by automatically converting the graphical data flow diagram into a hardware configuration program and configuring the FPGA device 200 with the hardware configuration program.

In another embodiment, the circuit simulation may be performed on the computer system 82, where the graphical data flow diagram is also executed on the computer system 82. In another embodiment the circuit simulation may be performed on a different computer system to which the computer system 82 is coupled via a network.

Figure 7:
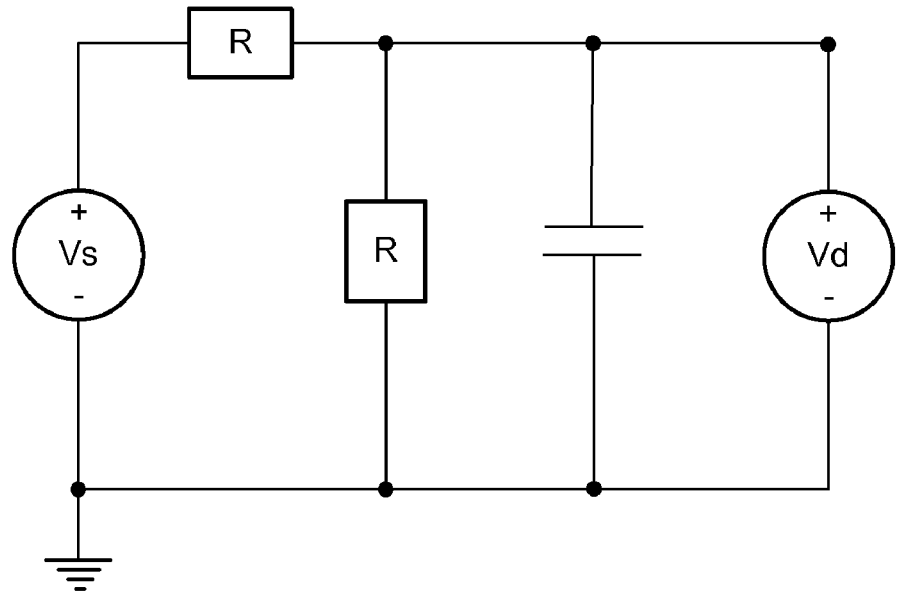
FIGS. 7-9 illustrate an exemplary circuit diagram and graphical data flow diagram connected to each other according to one embodiment of the method of FIG. 5.
Figure 8:
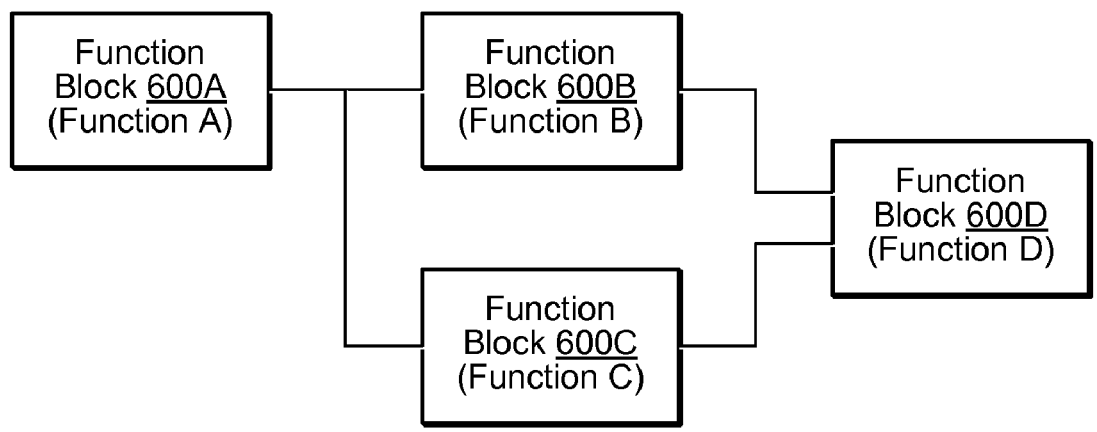
Figure 9:
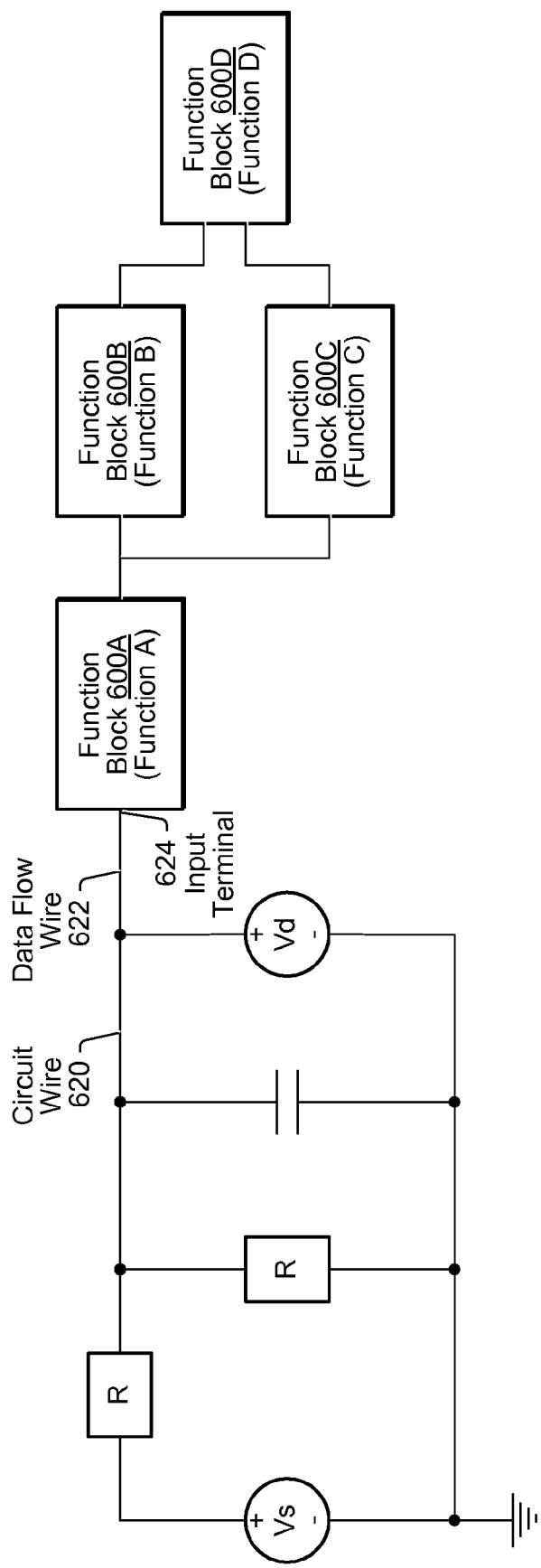

FIGS. 7-9 illustrate an exemplary circuit diagram and graphical data flow diagram connected to each other according to one embodiment of the method of FIG. 5. FIG. 7 illustrates an exemplary circuit diagram created according to one embodiment of block 301. The circuit diagram includes various icons representing components of the circuit, such as resistors, voltage source, ground, etc., and also includes wires connecting the circuit components together. The circuit diagram may be displayed on a display of the computer system 82.

FIG. 8 illustrates an exemplary graphical data flow diagram created according to one embodiment of block 303. The graphical data flow diagram may be displayed on a display of the computer system 82. The graphical data flow diagram includes various function blocks 600 connected according to a data flow representation. Each function block 600 is operable to perform a respective function when the graphical data flow diagram is executed. In this example, wires connected to the left side of a given function block 600 represent input to the function block, and wires connected to the right side of a given function block 600 represent output from the function block. For example, the graphical data flow diagram illustrates a wire connected from an output terminal of function block 600A to an input terminal of function block 600B, which visually indicates that output from function block 600A is passed as input to function block 600B.

FIG. 9 illustrates an exemplary compound diagram in which the circuit diagram of FIG. 7 is connected to the graphical data flow diagram of FIG. 8. More particularly, a circuit wire 620 of the circuit diagram is connected to an input terminal 624 of function block 600A in the graphical data flow diagram by a data flow wire 622. The data flow wire 622 visually indicates that a simulation value associated with the circuit wire 620 (e.g., a voltage value along the circuit wire 620) is computed by the circuit simulation and passed as input to the function block 600A in the graphical data flow diagram. Thus, the data flow wire 622 does not represent a wire in the circuit, but instead represents input to the graphical data flow diagram.

In an actual display of a compound diagram such as shown in FIG. 9 on a computer display screen, the wires of the circuit diagram may be visually distinguished from the data flow wire 622 and other wires of the graphical data flow diagram in order to visually indicate to the user that they are different types of wires, e.g., by displaying the two types of wires in different colors. For example, in some embodiments the wires of the graphical data flow diagram may represent data flow semantics among the blocks in the graphical data flow diagram, whereas the wires of the circuit diagram do not represent data flow semantics. Further, in some embodiments the wires of the circuit diagram may represent physical connections among physical components in the circuit, whereas the blocks of the graphical data flow diagram may not represent physical components, and the wires of the graphical data flow diagram may not represent physical connections.

Thus, when the compound diagram of FIG. 9 is run, the circuit simulation may be performed, e.g., by automatically analyzing the circuit diagram to generate a netlist, generating a set of equations or matrix coefficients based on the netlist, and performing the simulation based on the set of equations or matrix coefficients. The simulation may compute a voltage value along the circuit wire 620, and the voltage value may be passed as an input parameter to the function block 600A in the graphical data flow diagram. When the input to the function block 600A is ready, e.g., when the voltage value has been passed to the function block 600A, the function block 600A may execute. The function block 600A may produce an output value that is passed to the function blocks 600B and 600C, which may in turn execute in response to receiving the data from the function block 600A, and so on.

Figure 10:
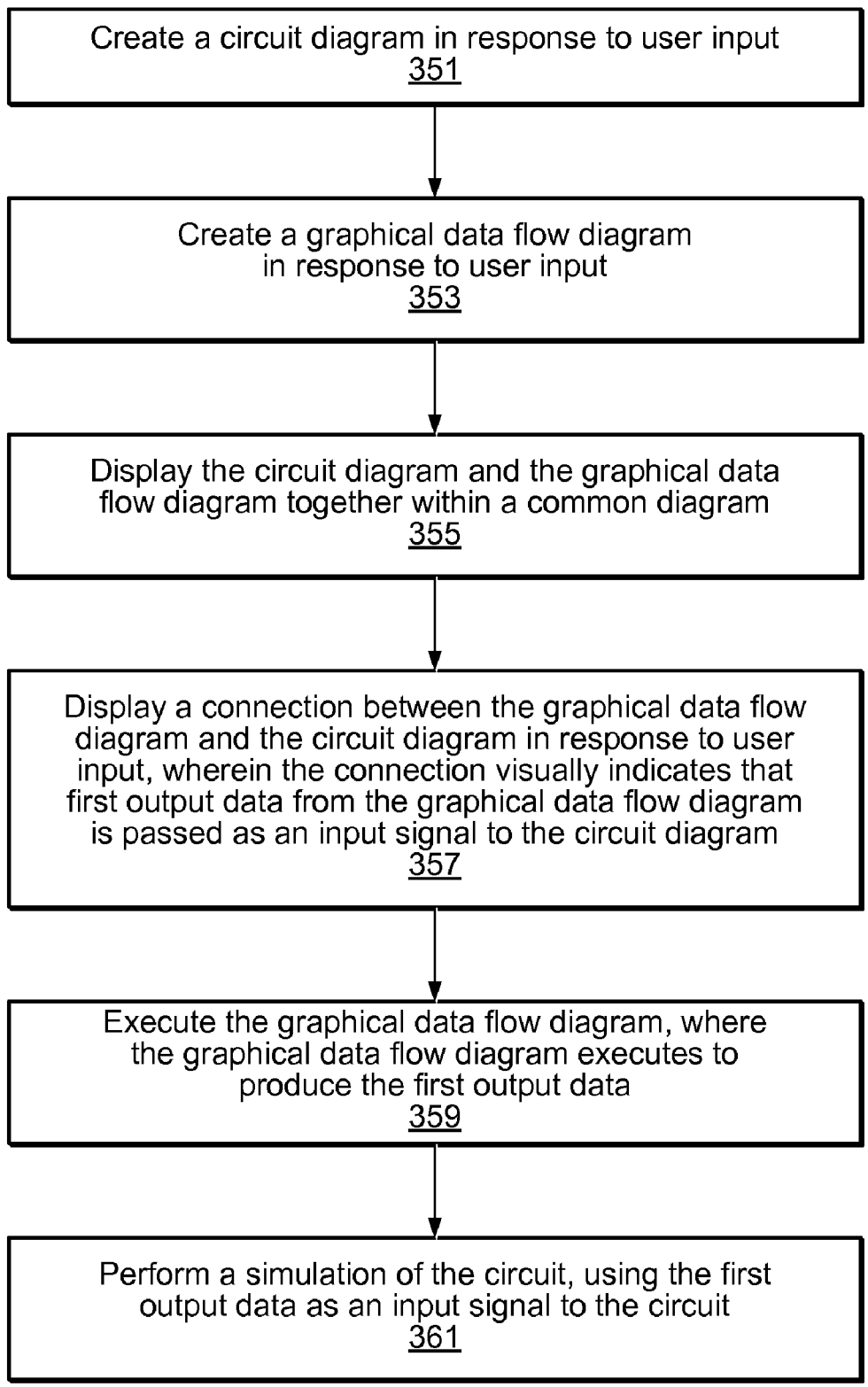
FIG. 10 is a flowchart diagram illustrating one embodiment of a method for creating, displaying, and running a compound diagram, where the compound diagram includes a graphical data flow diagram connected to a circuit diagram such that the graphical data flow diagram executes to produce output data that is provided as an input signal for a simulation performed based on the circuit diagram.

FIG. 10 is a flowchart diagram illustrating one embodiment of a method for creating, displaying, and running a compound diagram, where the compound diagram includes a graphical data flow diagram connected to a system diagram such that the graphical data flow diagram executes to produce output data that is provided as an input signal for a simulation performed based on the system diagram. It is noted that FIG. 10 represents an exemplary embodiment of the method, and various alternative embodiments are contemplated. The method of FIG. 10 may be implemented by diagramming software executing on the computer system 82.

In 351, a circuit diagram may be created in response to user input, similarly as described above.

In 353, a graphical data flow diagram in response to user input, similarly as described above.

In 355, the circuit diagram and the graphical data flow diagram may be displayed together within a common diagram, similarly as described above.

In 357, a connection may be displayed between the graphical data flow diagram and the circuit diagram in response to user input, wherein the connection visually indicates that first output data of the graphical data flow diagram is passed as an input signal to the circuit diagram. For example, the user may use a wiring tool or wiring function to create a wire, line, or other connection icon connecting the graphical data flow diagram to the circuit diagram.

For example, the user may provide user input causing a first wire to be displayed, where the first wire connects an output terminal of a block in the graphical data flow diagram to a wire or component in the circuit diagram. The first wire may visually indicate that data produced by the block in the graphical data flow diagram is provided as an input signal to the circuit diagram. For example, the data produced by the block in the graphical data flow diagram may represent voltage or other electrical characteristics of an input signal to the circuit.

In 339, the graphical data flow diagram may be executed. The graphical data flow diagram may execute to produce the first output data. In various embodiments the graphical data flow diagram may be operable to perform any function, process, or algorithm in order to produce output data useable as an input signal to the circuit.

In 361, the simulation of the may be performed circuit. As described above, the simulation of the circuit may depend on both the circuit itself (e.g., the components in the circuit, the properties of the components, and the connections among the components) and the input signal to the circuit. Thus, the simulation of the circuit may compute different simulation values for the circuit, depending on the input signal data received from the graphical data flow diagram.

Figure 11:
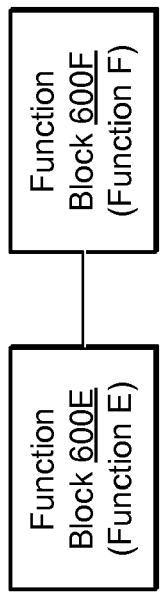
FIGS. 11 and 12 illustrate an exemplary circuit diagram and graphical data flow diagram connected to each other according to one embodiment of the method of FIG. 10.
Figure 12:
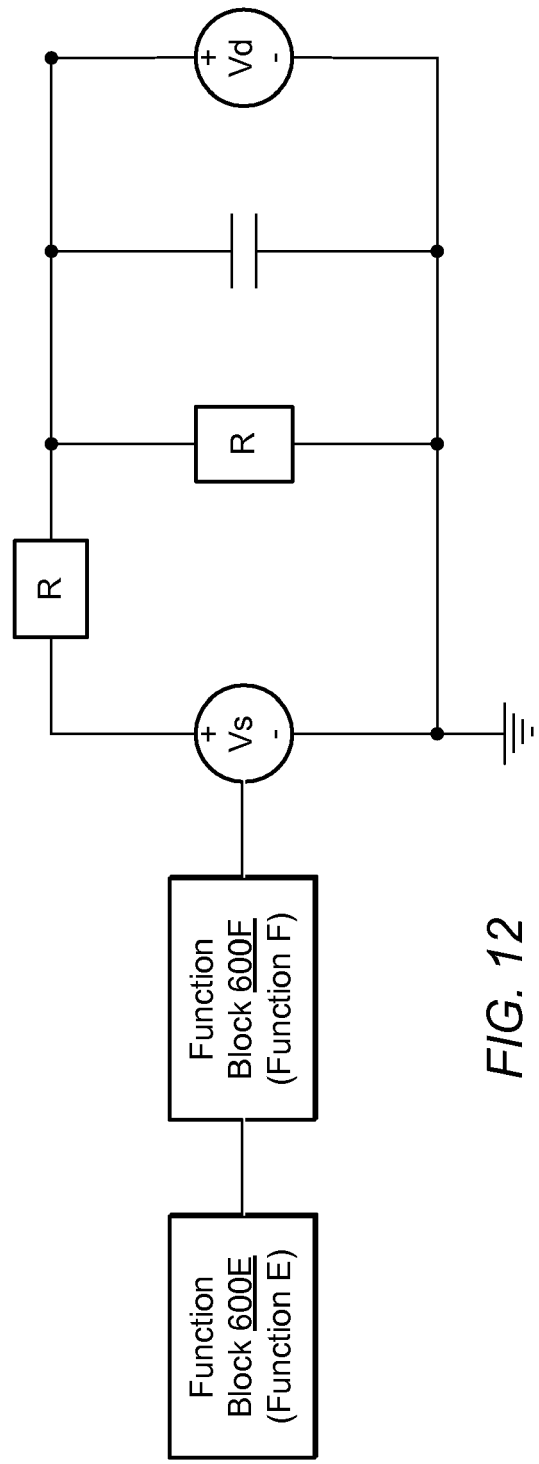

FIGS. 11 and 12 illustrate an exemplary circuit diagram and graphical data flow diagram connected to each other according to one embodiment of the method of FIG. 10. FIG. 11 illustrates an exemplary graphical data flow diagram created according to one embodiment of block 353. In this simple example, the graphical data flow diagram includes a function block 600E connected to a function block 600F.

FIG. 12 illustrates the graphical data flow diagram of FIG. 11 connected to the circuit diagram of FIG. 7. More particularly, an output terminal of the function block 600F is connected to an icon representing a voltage source in the circuit diagram. Thus, when the graphical data flow diagram is executed, the function block 600F may produce output data that is used as a voltage value for the voltage source when performing the simulation of the circuit.

Figure 13:
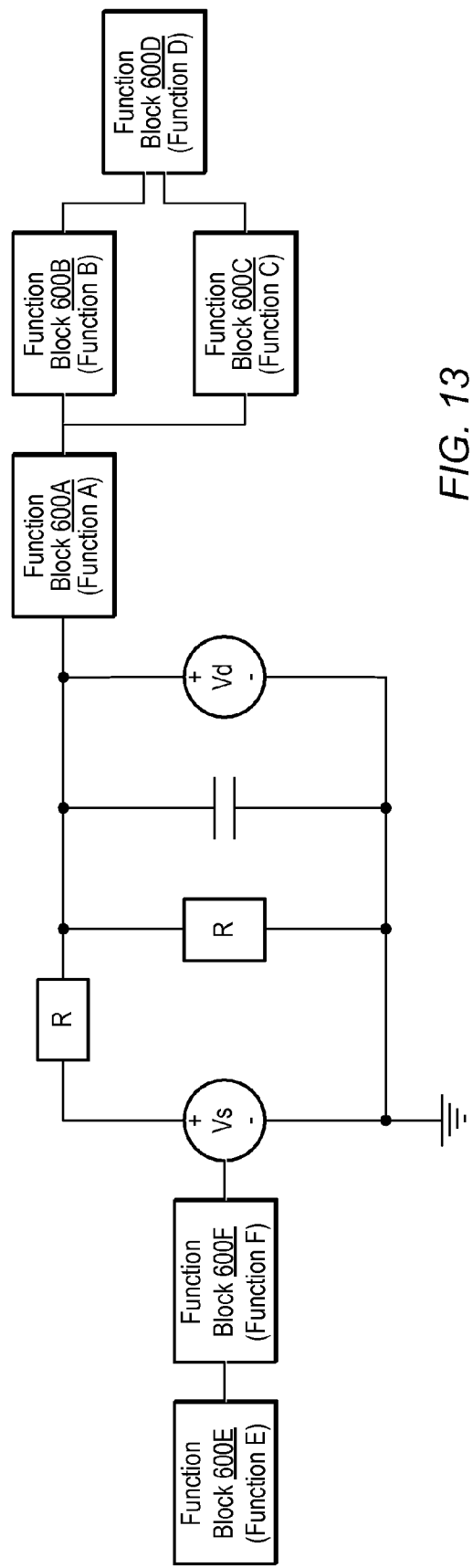
FIG. 13 illustrates an example in which the method of FIGS. 5 and 10 are combined.

FIG. 13 illustrates an example in which the method of FIGS. 5 and 10 are combined. A first graphical data flow diagram is connected to the circuit diagram to visually indicate that output of the first graphical data flow diagram is provided as an input signal for the circuit simulation, similarly as described above with reference to FIG. 12. A second graphical data flow diagram is connected to the circuit diagram to visually indicate that a simulation value computed by the circuit simulation is passed as input to the second graphical data flow diagram, similarly as described above with reference to FIG. 9.

In further embodiments of the methods described above, a graphical data flow diagram may execute to dynamically change or provide feedback to a circuit under simulation. The compound diagram may be run for a plurality of iterations or for a plurality of time steps. At each iteration or time step, a simulation value for the circuit may be computed by a simulation of the circuit, and the simulation value may be passed to the graphical data flow diagram. The graphical data flow diagram may perform a process or algorithm based on the simulation value and may then dynamically change or provide feedback to the circuit, depending on results of the process or algorithm. Thus, in the next iteration or time step, the behavior of the circuit or the circuit itself may be changed from the previous iteration or time step. Thus, the circuit simulation and the graphical data flow diagram may operate together to form a type of feedback loop in which simulation values computed by the circuit simulation influences execution of the graphical data flow diagram, and the execution of the graphical data flow diagram influences the circuit.

For example, in some embodiments the graphical data flow diagram may be operable to automatically change the topology of the circuit under simulation, e.g., by adding additional components to the circuit, removing components from the circuit, or changing how components in the circuit are connected to each other. For example, the graphical data flow diagram may execute an algorithm based on a voltage value computed by the circuit simulation, where the algorithm determines whether and how the circuit should be changed. As one simple example, depending on results of the algorithm, an additional resistor may be added to the circuit.

As another example, the graphical data flow diagram may be operable to automatically change properties of components in the circuit. For example, the graphical data flow diagram may execute an algorithm based on a voltage value computed by the circuit simulation, where the algorithm determines whether and how properties of components in the circuit should be changed. As one simple example, depending on results of the algorithm, the resistance of a resistor in the circuit may be increased or reduced.

In other embodiments the graphical data flow diagram may be operable to dynamically change an input signal to the circuit under simulation. For example, the graphical data flow diagram may execute an algorithm based on a voltage value computed by the circuit simulation, where the algorithm determines whether and how the input signal should be changed.

In other embodiments the graphical data flow diagram may be operable to dynamically change or provide feedback to the circuit based on information or events other than simulation values computed by the circuit simulation. As one example, the graphical data flow diagram may include a graphical user interface that is displayed on the display of the computer system 82 while the compound diagram is running. The user may be able to interact with the graphical user interface in order to cause the graphical data flow diagram to dynamically change the circuit or change an input signal to the circuit.

In various embodiments, the ability to dynamically change or provide feedback to a circuit under simulation may have a plethora of benefits. For example, the user may interact with a graphical user interface in order to dynamically change the circuit in various ways and observe the effects on the circuit's operation. For example, the graphical data flow diagram may receive various simulation values at each iteration or time step of the circuit simulation and display the simulation values in output indicators on the graphical user interface. The graphical user interface may also include input controls allowing the user to select various options or set properties affecting the circuit. In response to the user interacting with the input controls, the graphical data flow diagram may dynamically change the circuit as described above. Changing the circuit may cause the simulation values displayed in the output indicators to change in subsequent iterations or time steps, thus enabling the user to see the effects of changing the circuit. This may be useful, for example, for instructors demonstrating the effects of various circuit changes to students or for helping circuit developers design a circuit more efficiently.

As other examples, the ability to dynamically change or provide feedback to a circuit under simulation may be useful for applications such as hardware-in-the-loop simulations and rapid control prototyping simulations.

In various embodiments, dynamically changing the circuit simulation or providing feedback from the graphical data flow diagram to the circuit simulation may be implemented in various ways. For example, in some embodiments the graphical data flow diagram may be operable to change the circuit by automatically changing one or more data structures that represent the circuit diagram. In subsequent iterations or time steps, the simulation of the circuit may be performed based on the changed circuit diagram. For example, in response to the change to the circuit diagram, a new netlist describing the changed circuit may be automatically generated, and the netlist may be converted into updated equations or data structures used in the subsequent iterations or time steps of the circuit simulation. In other embodiments the graphical data flow diagram may directly change the netlist describing the circuit instead of changing the circuit diagram.

In some embodiments the circuit diagram may be displayed on a display of the computer system 82 while the compound diagram is running, and the diagramming software may be operable to update the displayed circuit diagram in response to dynamic changes to the circuit diagram. For example, if the graphical data flow diagram executes to add an additional resistor component to the circuit then the diagramming software may automatically display a changed circuit diagram illustrating the additional resistor.

In various embodiments the user may configure the graphical data flow diagram to dynamically change or provide feedback to the circuit under simulation in any of various ways. For example, in some embodiments the user may create a wire or other graphical information connecting the graphical data flow diagram to the circuit diagram, where the wire visually indicates that the graphical data flow diagram provides feedback to or dynamically changes the circuit under simulation. Thus, for example, a compound diagram may display a first connection from the circuit diagram to the graphical data flow diagram, where the first connection visually indicates that a simulation value computed by a simulation of the circuit is passed as input data to the graphical data flow diagram, and the compound diagram may also display a second connection from the graphical data flow diagram to the circuit diagram, where the second connection visually indicates that the graphical data flow diagram dynamically changes or provides feedback to the circuit under simulation.

In other embodiments the graphical data flow diagram may be configured to set a global variable or change data structures representing the circuit under simulation, without necessarily visually displaying a connection indicating feedback from the graphical data flow diagram to the circuit.

Figure 14:
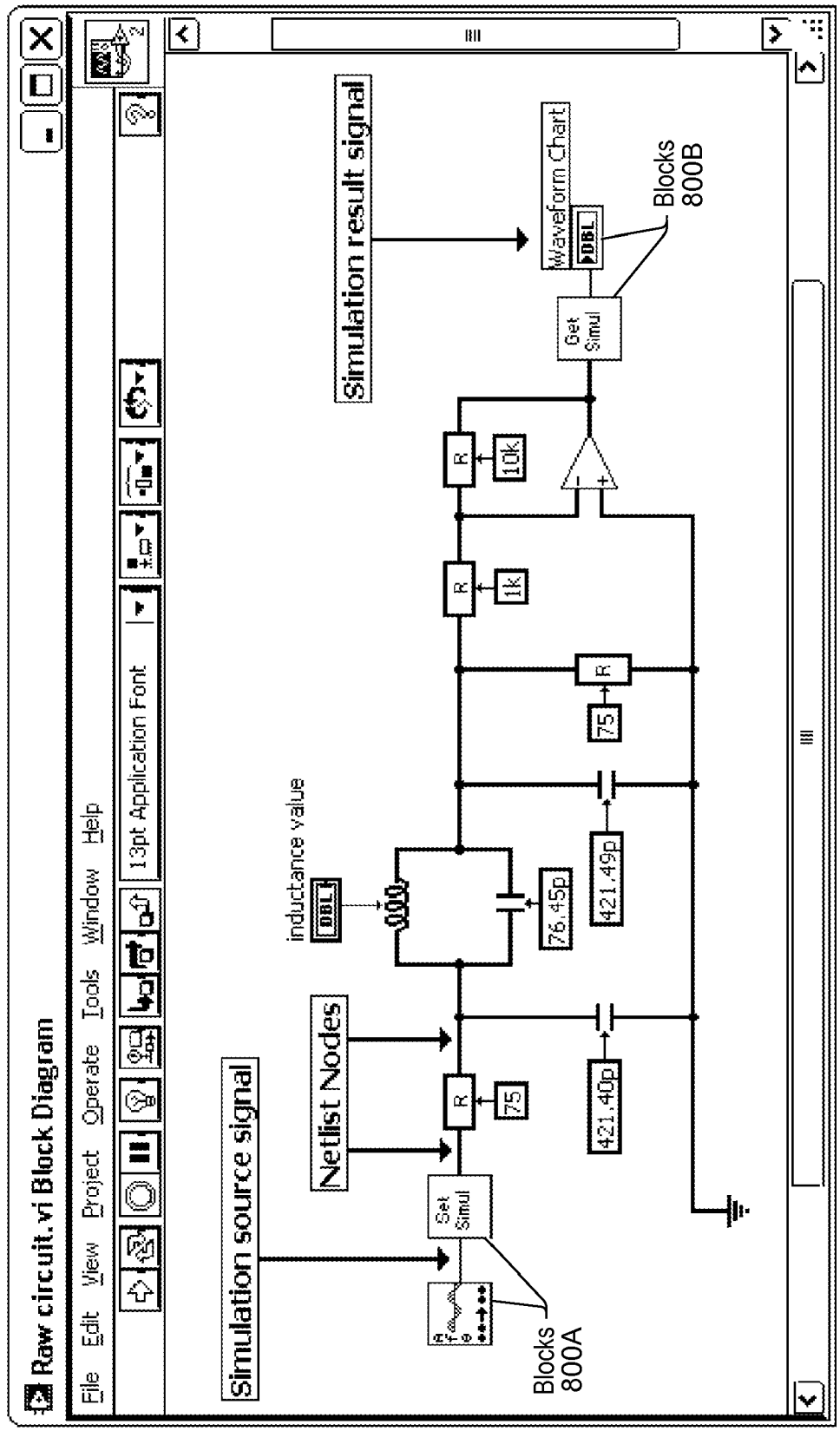
FIGS. 14-20 illustrate several exemplary compound diagrams in which circuit diagrams are connected to graphical data flow diagrams.

FIGS. 14-20 illustrate several examples of compound diagrams such as described above. For example, FIG. 14 illustrates an example in which a circuit diagram is connected to graphical data flow diagram blocks 800A and 800B. The graphical data flow diagram blocks 800A execute to produce data that is provided as input signal to a circuit simulation performed on the circuit diagram. The circuit simulation produces a simulation value that is passed as input to the graphical data flow diagram blocks 800B. In this simple example the graphical data flow diagram blocks 800B simply display the simulation value in a waveform chart indicator on a graphical user interface.

Figure 15:
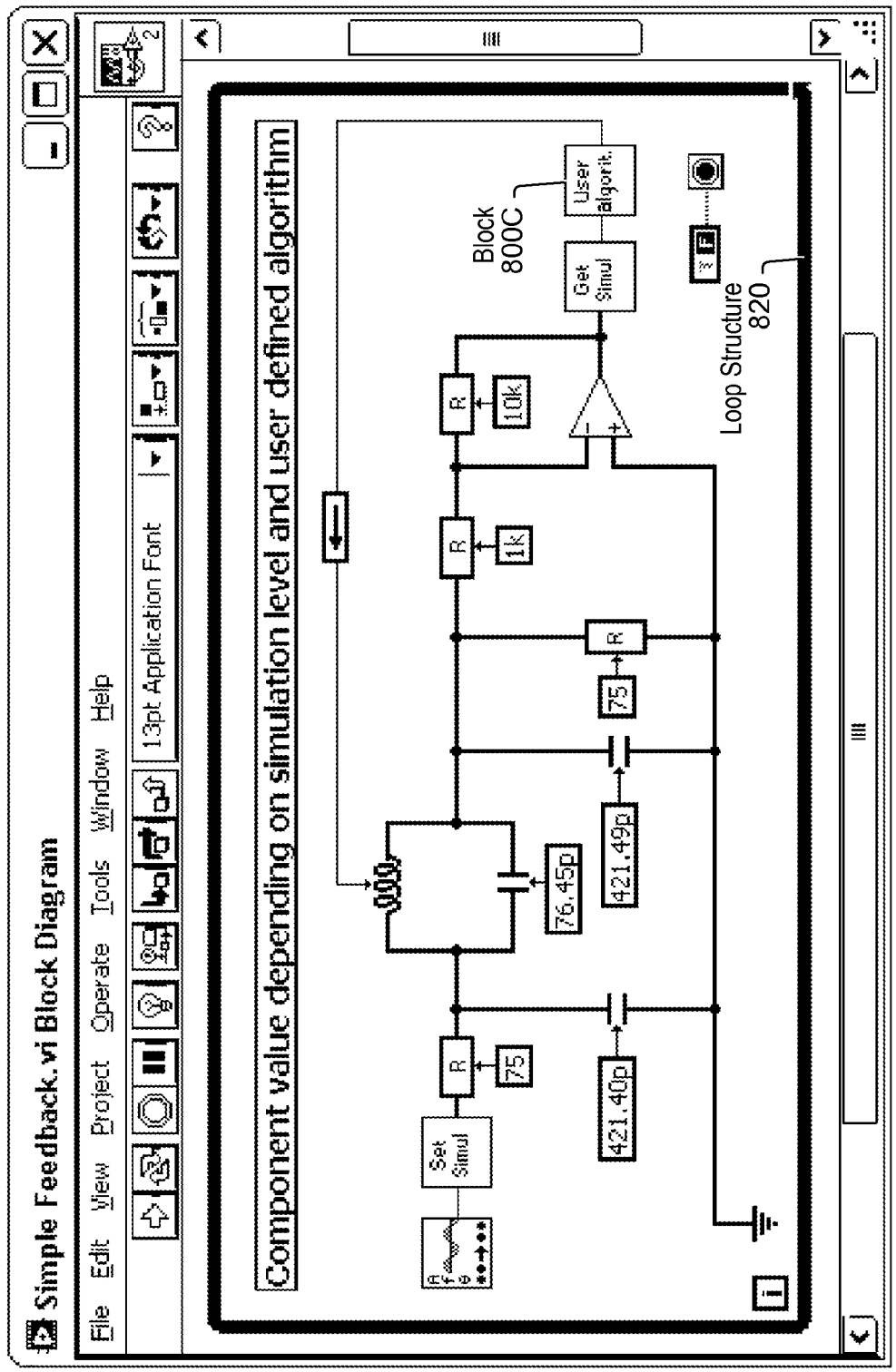

FIG. 15 illustrates an example similar to the example of FIG. 14. However, in this example, the circuit diagram and the graphical data flow diagrams are displayed within a loop structure 820. The loop structure 820 indicates that the circuit is simulated and the graphical data flow diagrams are executed for a plurality of iterations or time steps. FIG. 15 also illustrates a connection from the block 800C labeled "User algorit." to the circuit diagram. The block 800C may represent an arbitrarily complex algorithm that uses the simulation value received from the circuit simulation as input. For example, the block 800C may encapsulate a more complex graphical data flow diagram (or may be replaced within the diagram of FIG. 15 with a more complex graphical data flow diagram). In this example, the output terminal of the block 800C is connected to an inductor component icon in the circuit diagram. Thus, for example, the algorithm implemented by the graphical data flow diagram may execute to dynamically change the inductance of the inductor component depending on the simulation value passed as input to the algorithm.

Figure 16:
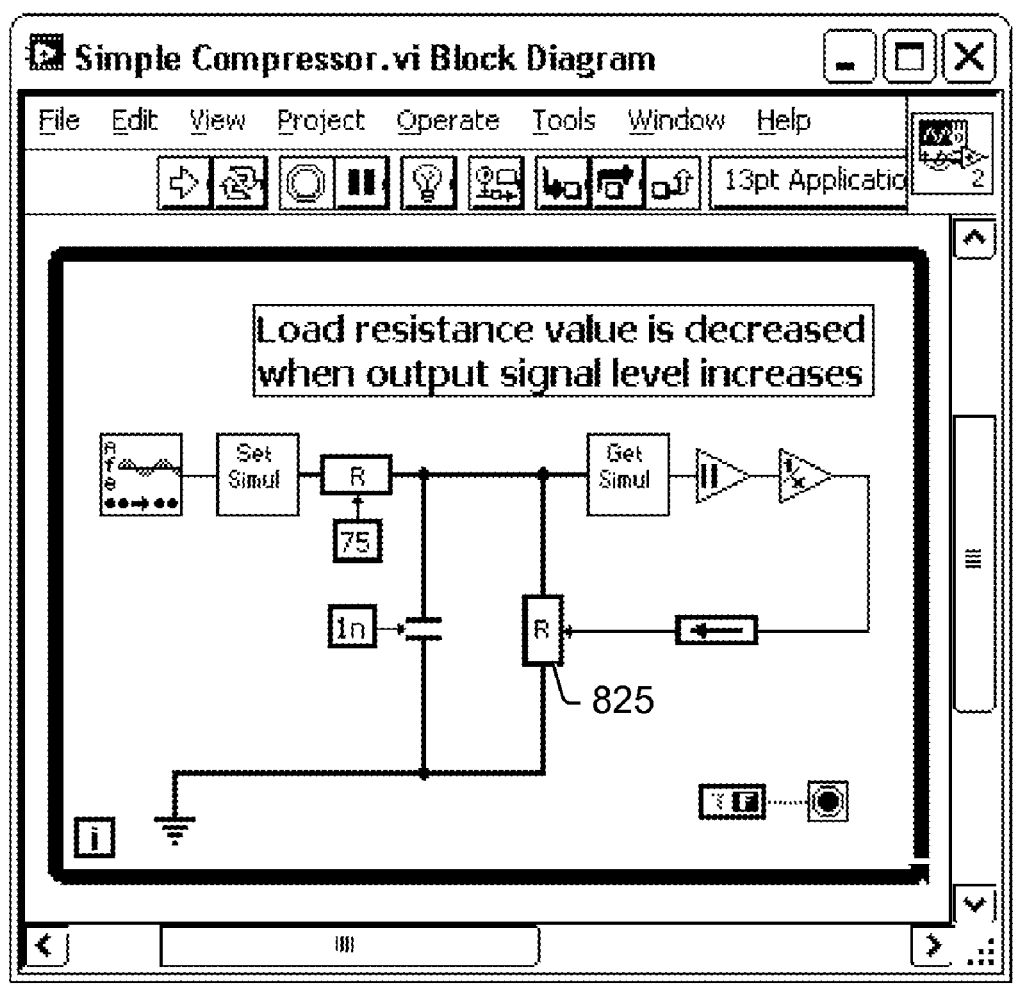

FIG. 16 illustrates an example of adaptive processing in which resistance of the resistor 825 in the circuit is dynamically changed according to the level of a simulation value computed by the circuit simulation. The load resistance value is decreased when the output signal level increases. The shown example acts like a compressor.

Figure 17:
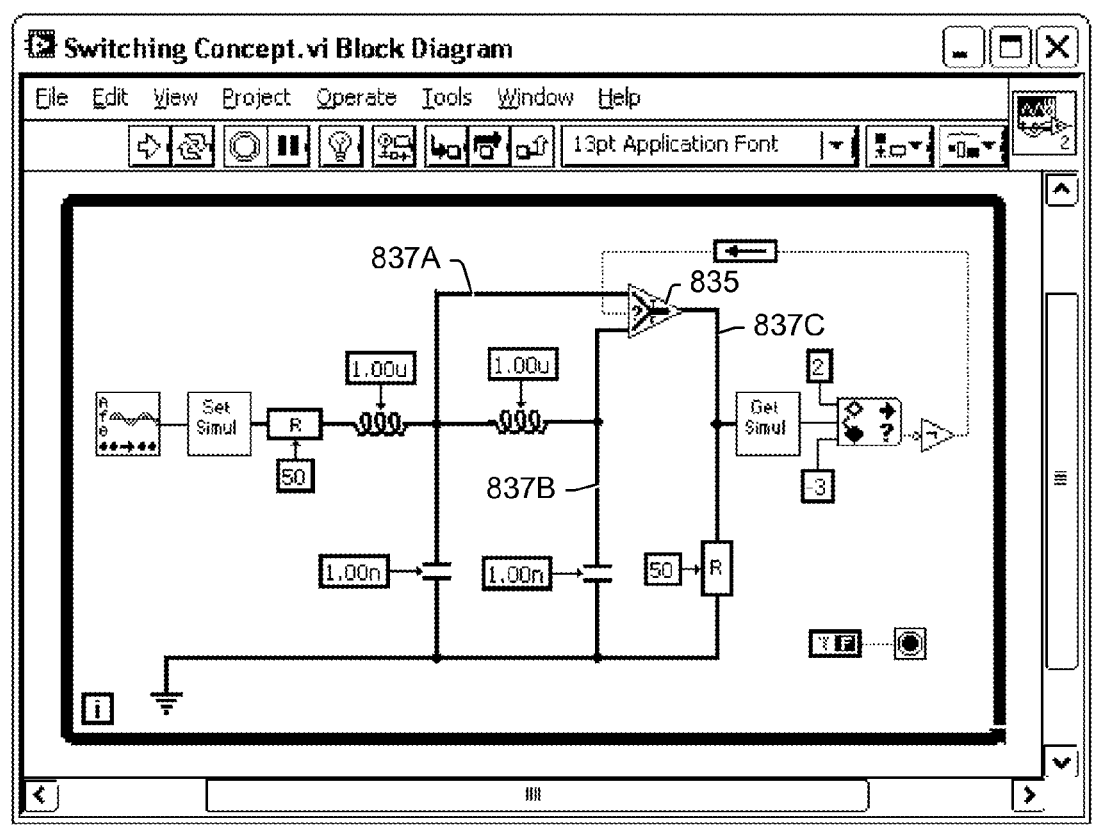

In some embodiments, graphical programming blocks may be incorporated within a circuit diagram. For example, FIG. 17 illustrates an example in which a graphical program select block 835 is included in the circuit diagram. The select block 835 does not represent a component of the circuit per se, but instead affects a simulation value computed by the simulation of the circuit. In this example, two circuit wires 837A and 837B are connected to the left side of the select block 835. The select block 835 may also be configured with a threshold value in response to user input. When the circuit simulation is performed, the simulation output values (e.g., voltages) computed for the circuit wires 837A and 837B may be compared to the threshold value specified for the block 835. The simulation output value (e.g., voltage) computed for the circuit wire 837C connected to the output terminal of the block 835 depends on whether the simulation values for the circuit wires 837A and 837B exceed the threshold value. In the shown example, the simulation output is changed from a lower order low-pass filter to a higher order low-pass filter when the output signal gets too large.

Figure 19:
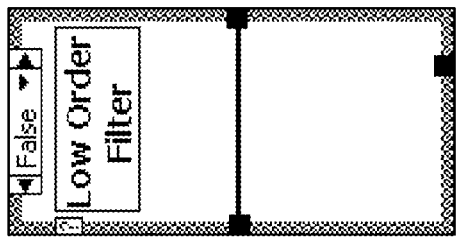
Figure 18:
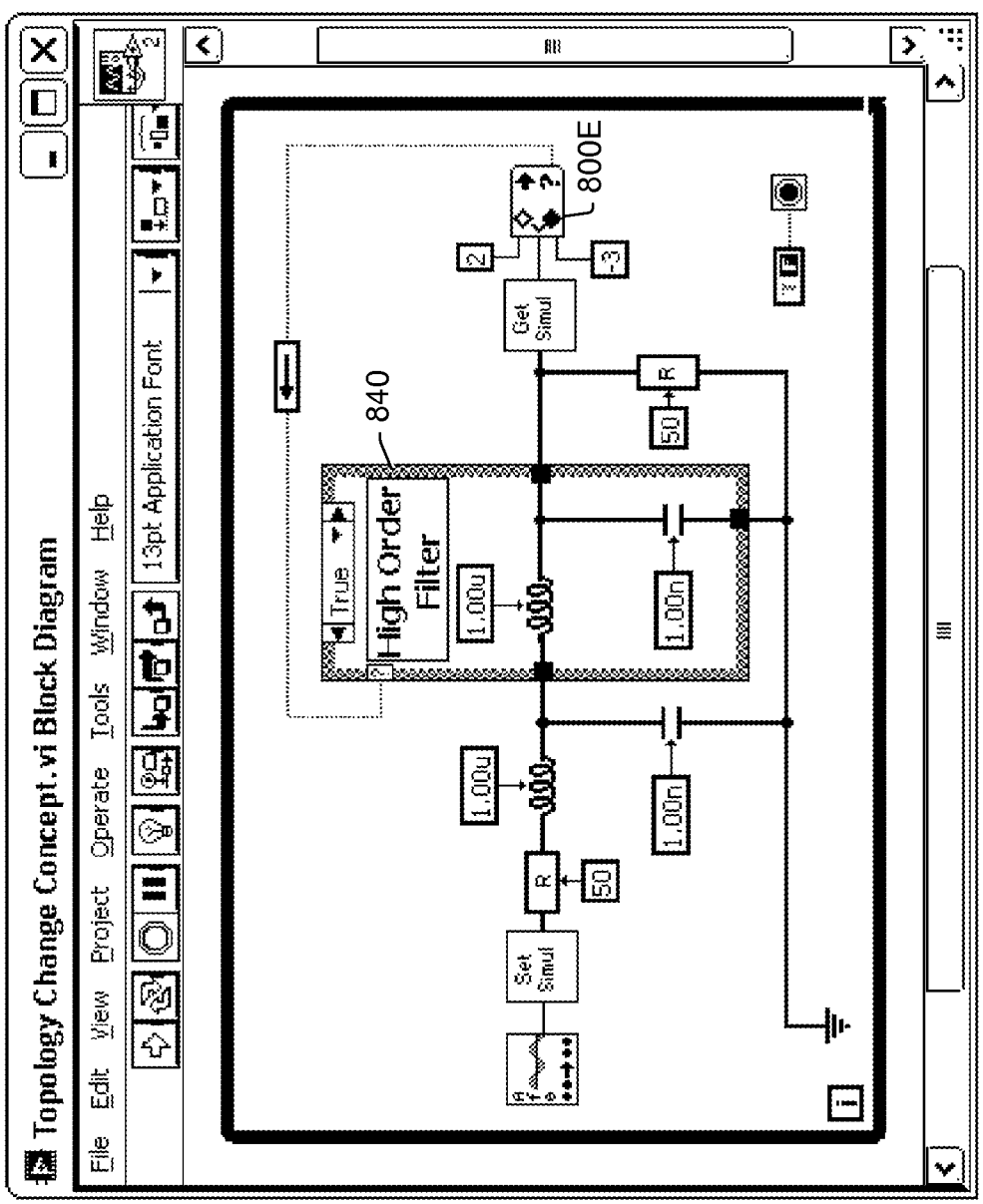

FIG. 18 illustrates another example in which a graphical program block is included in a circuit diagram. In this case, a case structure block 840 is included in the circuit diagram. The block 800E computes a Boolean value and passes the Boolean value to the case structure block 840. If the value is True, then the case structure frame shown in FIG. 18 is selected. If the value is False, then the case structure frame shown in FIG. 19 is selected. As shown, the case structure frame in FIG. 18 includes extra circuit components compared to the case structure frame in FIG. 19. Thus, the case structure block 840 is operable to dynamically change the topology of the circuit, depending on feedback from the block 800E, where the feedback from the block 800E in turn depends on simulation values computed by the circuit simulation. In this example, the order of a low-pass filter is increased when a signal level becomes lager than a user defined threshold value configured for the block 800E.

Figure 20:
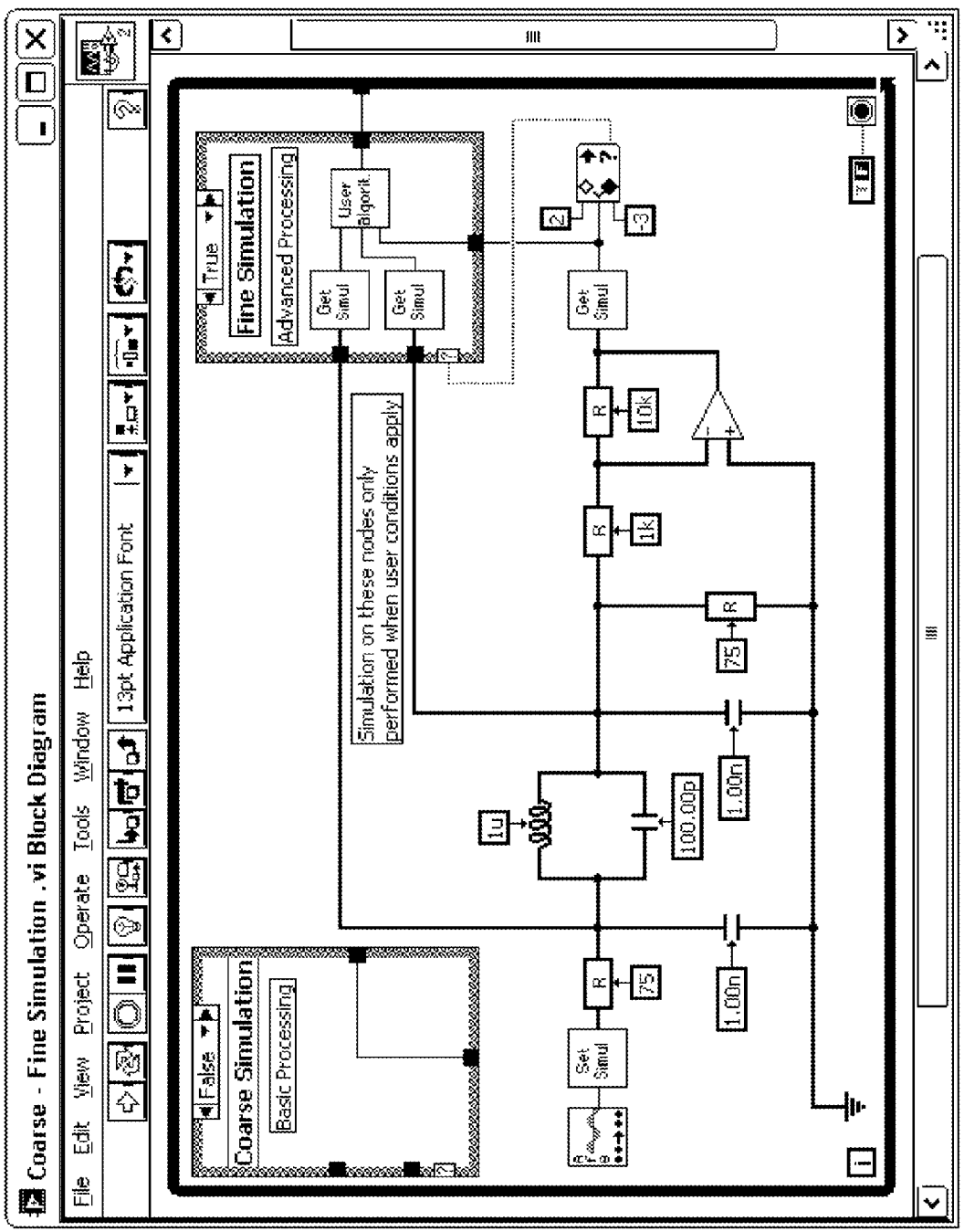

FIG. 20 illustrates an adaptive monitoring example in which a single signal is used to monitor a simulation result, and depending on the monitored values, the simulation of more signals may or may not be instantiated. This can be used, for example, to speed up a simulation by always performing a 'coarse' monitoring simulation and only perform the 'fine' simulation when specific conditions in the coarse simulation result are present.

Thus, various embodiments of the methods described above may be employed in order to implement a development environment in which circuit simulation techniques are combined with graphical programming techniques in a common environment.

It is noted that FIGS. 14-20 illustrate particular embodiments of diagrams created according to the methods described above and are not intended to limit the scope of the methods. Numerous alternative embodiments of compound diagrams including both circuit diagrams and graphical data flow diagrams are contemplated.

As described above, in various embodiments, a graphical data flow diagram may be combined with any of various kinds of system diagrams other than circuit diagrams. Thus, methods similar to those described above may be utilized to integrate graphical data flow programming techniques with simulations performed to model any of various kinds of systems, such as mechanical, chemical, or neural systems, to name a few examples. Furthermore, any of various techniques may be used in simulating the systems, such as time domain response simulations techniques, frequency domain response simulation techniques, etc.

It is noted that various embodiments may further include receiving, sending, or storing instructions and/or data implemented in accordance with the foregoing description upon a computer-readable memory medium. Generally speaking, a computer-readable memory medium may include storage media or memory media such as magnetic or optical media, e.g., disk or CD-ROM, volatile or non-volatile media such as RAM (e.g. SDRAM, DDR SDRAM, RDRAM, SRAM, etc.), ROM, etc. for storing program instructions. Such a computer-readable memory medium may store program instructions received from or sent on any transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A computer-implemented method for simulating a circuit, the method comprising:

displaying on a display a circuit diagram, wherein the circuit diagram represents the circuit, wherein the circuit diagram comprises a plurality of components interconnected by wires, wherein the wires interconnecting the plurality of components in the circuit diagram comprise wires of a first type, and wherein the wires of the first type do not represent data flow semantics among the components in the circuit diagram;

displaying on the display a graphical data flow diagram connected to the circuit diagram, wherein the graphical data flow diagram comprises a plurality of interconnected blocks that visually indicate functionality of the graphical data flow diagram, wherein the blocks in the graphical data flow diagram are interconnected by wires of a second type, and wherein the wires of the second type represent data flow semantics among the blocks in the graphical data flow diagram;

performing a simulation of the circuit; and executing the graphical data flow diagram, wherein said executing the graphical data flow diagram comprises one or more of:

passing a first simulation value computed by the simulation of the circuit as input to the graphical data flow diagram; or producing output data, wherein the output data is provided as an input signal for the simulation of the circuit.

2. The method of claim 1,
wherein the wires between the blocks in the graphical data flow diagram visually indicate that data produced by one block is used by another block.

3. The method of claim 1,
wherein said displaying the graphical data flow diagram connected to the circuit diagram comprises displaying a first wire from the circuit diagram to a first block in the graphical data flow diagram, wherein the first wire visually indicates that the first simulation value computed by the simulation of the circuit is passed as input to the first block in the graphical data flow diagram;
wherein said passing the first simulation value to the graphical data flow diagram comprises passing the first simulation value to the first block in the graphical data flow diagram.

4. The method of claim 1,
wherein said displaying the graphical data flow diagram connected to the circuit diagram comprises displaying a first wire from a first block in the graphical data flow diagram to the circuit diagram, wherein the first wire visually indicates that the output data produced by executing the first block in the graphical data flow diagram is provided as the input signal for the simulation of the circuit.

5. The method of claim 1,
wherein said performing the simulation of the circuit comprises computing the first simulation value, wherein the first simulation value is passed as input to the graphical data flow diagram;
wherein the graphical data flow diagram executes to perform one or more of:
displaying the first simulation value;
analyzing the first simulation value; or
performing an algorithm based on the first simulation value.

6. The method of claim 1, wherein said performing the simulation of the circuit comprises:
automatically generating a netlist based on the circuit diagram; and
performing the simulation of the circuit based on the netlist.

7. The method of claim 1,
wherein the wires of the first type have a first appearance, and wherein the wires of the second type have a second appearance to visually distinguish the wires of the first type from the wires of the second type.

8. The method of claim 1,
wherein the wires of the first type represent physical connections among components in the circuit;
wherein the wires of the second type do not represent physical connections.

9. The method of claim 1,
wherein said executing the graphical data flow diagram provides feedback to the simulation of the circuit.

10. The method of claim 1,
wherein said executing the graphical data flow diagram further comprises modifying the circuit.

11. The method of claim 10,
wherein said modifying the circuit comprises changing a component of the circuit.

12. The method of claim 10,
wherein said modifying the circuit comprises changing a topology of the circuit.

13. The method of claim 10,
wherein said modifying the circuit comprises adding a component to the circuit.

14. The method of claim 1, further comprising:
creating the circuit diagram in response to user input.

15. The method of claim 1, further comprising:
creating the graphical data flow diagram in response to user input.

16. A computer-readable memory medium for simulating a circuit, the memory medium comprising program instructions executable to:

display on a display a circuit diagram, wherein the circuit diagram represents the circuit, wherein the circuit diagram comprises a plurality of components interconnected by wires, wherein the wires interconnecting the plurality of components in the circuit diagram comprise wires of a first type, and wherein the wires of the first type do not represent data flow semantics among the components in the circuit diagram;

display on the display a graphical data flow diagram connected to the circuit diagram, wherein the graphical data flow diagram comprises a plurality of interconnected blocks that visually indicate functionality of the graphical data flow diagram, wherein the blocks in the graphical data flow diagram are interconnected by wires of a second type, and wherein the wires of the second type represent data flow semantics among the blocks in the graphical data flow diagram;

perform a simulation of the circuit; and execute the graphical data flow diagram, wherein said executing the graphical data flow diagram comprises one or more of:

passing a first simulation value computed by the simulation of the circuit as input to the graphical data flow diagram; or producing output data, wherein the output data is provided as an input signal for the simulation of the circuit.

17. The memory medium of claim 16,
wherein said displaying the graphical data flow diagram connected to the circuit diagram comprises displaying a first wire from the circuit diagram to a first block in the graphical data flow diagram, wherein the first wire visually indicates that the first simulation value computed by the simulation of the circuit is passed as input to the first block in the graphical data flow diagram;

wherein said passing the first simulation value to the graphical data flow diagram comprises passing the first simulation value to the first block in the graphical data flow diagram.

18. The memory medium of claim 16, wherein said displaying the graphical data flow diagram connected to the circuit diagram comprises displaying a first wire from a first block in the graphical data flow diagram to the circuit diagram, wherein the first wire visually indicates that the output data produced by executing the first block in the graphical data flow diagram is provided as the input signal for the simulation of the circuit.

19. The memory medium of claim 16, wherein said performing the simulation of the circuit comprises computing the first simulation value, wherein the first simulation value is passed as input to the graphical data flow diagram;

wherein the graphical data flow diagram executes to perform one or more of:
  displaying the first simulation value;
  analyzing the first simulation value; or
  performing an algorithm based on the first simulation value.

20. The memory medium of claim 16, wherein said performing the simulation of the circuit comprises:
  automatically generating a netlist based on the circuit diagram; and
  performing the simulation of the circuit based on the netlist.

21. The memory medium of claim 16, wherein the wires of the first type have a first appearance, and wherein the wires of the second type have a second appearance to visually distinguish the wires of the first type from the wires of the second type.

22. The memory medium of claim 16, wherein the wires of the first type represent physical connections among components in the circuit;

wherein the wires of the second type do not represent physical connections.

23. The memory medium of claim 16, wherein said executing the graphical data flow diagram further comprises modifying the circuit.

24. The memory medium of claim 23, wherein said modifying the circuit comprises changing a component of the circuit.

25. The memory medium of claim 23, wherein said modifying the circuit comprises changing a topology of the circuit.

26. The memory medium of claim 23, wherein said modifying the circuit comprises adding a component to the circuit.

27. The memory medium of claim 16, wherein the program instructions are further executable to:
  create the circuit diagram in response to user input.

28. The memory medium of claim 16, wherein the program instructions are further executable to:
  create the graphical data flow diagram in response to user input.

29. A computer-implemented method for simulating a system, the method comprising:
  displaying on a display a circuit diagram in response to user input, wherein the circuit diagram comprises a plurality of components connected by wires, wherein the wires interconnecting the plurality of components in the circuit diagram comprise wires of a first type, and wherein the wires of the first type represent physical connections among components in the circuit;
  displaying on the display a graphical data flow diagram connected to the circuit diagram in response to user input, wherein the graphical data flow diagram comprises a plurality of interconnected blocks that visually indicate functionality of the graphical data flow diagram, wherein the blocks in the graphical data flow diagram are interconnected by wires of a second type, and wherein the wires of the second type represent data flow semantics among the blocks in the graphical data flow diagram;
  simulating the circuit, wherein said simulating comprises computing at least one simulation value; and
  executing the graphical data flow diagram, wherein said executing comprises modifying at least a portion of the circuit based on the at least one simulation value.

30. A computer-implemented method for simulating a system, the method comprising:
  displaying on a display a circuit diagram in response to user input, wherein the circuit diagram comprises a plurality of components connected by wires, wherein the wires interconnecting the plurality of components in the circuit diagram comprise wires of a first type, and wherein the wires of the first type represent physical connections among components in the circuit;
  displaying on the display a graphical data flow diagram connected to the circuit diagram in response to user input, wherein the graphical data flow diagram comprises a plurality of interconnected blocks that visually indicate functionality of the graphical data flow diagram, wherein the blocks in the graphical data flow diagram are interconnected by wires of a second type, and wherein the wires of the second type do not represent physical connections;
  simulating the circuit, wherein said simulating comprises computing at least one simulation value; and
  executing the graphical data flow diagram, wherein said executing comprises analyzing the at least one simulation value.

31. The method of claim 30, wherein said displaying the graphical data flow diagram connected to the circuit diagram comprises displaying a first wire from the circuit diagram to a first block in the graphical data flow diagram, wherein the first wire visually indicates that the at least one simulation value computed by the simulation of the circuit is passed as input to the first block in the graphical data flow diagram.

32. The method of claim 30, wherein said displaying the graphical data flow diagram connected to the circuit diagram comprises displaying a first wire from a first block in the graphical data flow diagram to the circuit diagram, wherein the first wire visually indicates that output data produced by executing the first block in the graphical data flow diagram is provided as an input signal for said simulating the circuit.

33. The method of claim 30, wherein said simulating the circuit comprises:
  automatically generating a netlist based on the circuit diagram; and
  performing the simulation of the circuit based on the netlist.

34. The method of claim 30, wherein the wires of the first type have a first appearance, and wherein the wires of the second type have a second appearance to visually distinguish the wires of the first type from the wires of the second type.

35. The method of claim 30, wherein said executing the graphical data flow diagram provides feedback for said simulating the circuit.

36. The method of claim 30, wherein said executing the graphical data flow diagram further comprises modifying the circuit.

37. A computer accessible memory medium storing program instructions executable for simulating a circuit, wherein the program instructions are executable by a processor to:
 display on a display a circuit diagram in response to user input, wherein the circuit diagram comprises a plurality of components connected by wires, wherein the wires interconnecting the plurality of components in the circuit diagram comprise wires of a first type, and wherein the wires of the first type represent physical connections among components in the circuit;
 display on the display a graphical data flow diagram connected to the circuit diagram in response to user input, wherein the graphical data flow diagram comprises a plurality of interconnected blocks that visually indicate functionality of the graphical data flow diagram, wherein the blocks in the graphical data flow diagram are interconnected by wires of a second type, and wherein the wires of the second type do not represent physical connections;
 simulate the circuit, wherein said simulating comprises computing at least one simulation value; and
 execute the graphical data flow diagram, wherein said executing comprises analyzing the at least one simulation value.

38. The memory medium of claim 37, wherein said displaying the graphical data flow diagram connected to the circuit diagram comprises displaying a first wire from the circuit diagram to a first block in the graphical data flow diagram, wherein the first wire visually indicates that the at least one simulation value computed by the simulation of the circuit is passed as input to the first block in the graphical data flow diagram.

39. The memory medium of claim 37, wherein said displaying the graphical data flow diagram connected to the circuit diagram comprises displaying a first wire from a first block in the graphical data flow diagram to the circuit diagram, wherein the first wire visually indicates that output data produced by executing the first block in the graphical data flow diagram is provided as an input signal for said simulating the circuit.

40. The memory medium of claim 37, wherein said simulating the circuit comprises:
 automatically generating a netlist based on the circuit diagram; and
 performing the simulation of the circuit based on the netlist.

41. The memory medium of claim 37, wherein the wires of the first type have a first appearance, and wherein the wires of the second type have a second appearance to visually distinguish the wires of the first type from the wires of the second type.

42. The memory medium of claim 37, wherein said executing the graphical data flow diagram provides feedback for said simulating the circuit.

43. The memory medium of claim 37, wherein said executing the graphical data flow diagram further comprises modifying the circuit.

44. A computer accessible memory medium storing program instructions executable for simulating a circuit, wherein the program instructions are executable by a processor to:
 display on a display a circuit diagram in response to user input, wherein the circuit diagram comprises a plurality of interconnected components, wherein the connections interconnecting the plurality of components in the circuit diagram comprise connections of a first type, and wherein the connections of the first type represent physical connections among components in the circuit;
 display on the display a graphical data flow diagram connected to the circuit diagram in response to user input, wherein the graphical data flow diagram comprises a plurality of interconnected blocks that visually indicate functionality of the graphical data flow diagram, wherein the blocks in the graphical data flow diagram are interconnected by connections of a second type, and wherein the connections of the second type represent data flow semantics among the blocks in the graphical data flow diagram;
 simulate the circuit, wherein said simulating comprises computing at least one simulation value; and
 execute the graphical data flow diagram, wherein said executing comprises analyzing the at least one simulation value.

45. The memory medium of claim 44, wherein said displaying the graphical data flow diagram connected to the circuit diagram comprises displaying a first connection from the circuit diagram to a first block in the graphical data flow diagram, wherein the first connection visually indicates that the first simulation value computed by the simulation of the circuit is passed as input to the first block in the graphical data flow diagram.

46. The memory medium of claim 44, wherein said displaying the graphical data flow diagram connected to the circuit diagram comprises displaying a first connection from a first block in the graphical data flow diagram to the circuit diagram, wherein the first connection visually indicates that output data produced by executing the first block in the graphical data flow diagram is provided as an input signal for said simulating the circuit.

47. The memory medium of claim 44, wherein said simulating the circuit comprises:
 automatically generating a netlist based on the circuit diagram; and
 performing the simulation of the circuit based on the netlist.

48. The memory medium of claim 44, wherein the connections of the first type have a first appearance, and wherein the connections of the second type have a second appearance to visually distinguish the connections of the first type from the connections of the second type.

49. The memory medium of claim 44, wherein said executing the graphical data flow diagram provides feedback for said simulating the circuit.

50. The memory medium of claim 44, wherein said executing the graphical data flow diagram further comprises modifying the circuit.

* * * * *